(12) United States Patent
Morinaga

(10) Patent No.: US 11,625,114 B2
(45) Date of Patent: Apr. 11, 2023

(54) ARRAY SUBSTRATE AND DISPLAY DEVICE

(71) Applicant: SHARP KABUSHIKI KAISHA, Sakai (JP)

(72) Inventor: Junichi Morinaga, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/502,663

(22) Filed: Oct. 15, 2021

(65) Prior Publication Data

US 2022/0137740 A1  May 5, 2022

Related U.S. Application Data

(60) Provisional application No. 63/107,813, filed on Oct. 30, 2020.

(51) Int. Cl.

| | | |
|---|---|---|
| *G06F 3/041* | (2006.01) | |
| *G02F 1/1362* | (2006.01) | |
| *G02F 1/1368* | (2006.01) | |
| *G02F 1/1333* | (2006.01) | |
| *H01L 27/12* | (2006.01) | |
| *G06F 3/044* | (2006.01) | |
| *G02F 1/1343* | (2006.01) | |
| *G02F 1/1335* | (2006.01) | |

(52) U.S. Cl.
CPC .......... *G06F 3/0412* (2013.01); *G02F 1/1368* (2013.01); *G02F 1/13338* (2013.01); *G02F 1/133345* (2013.01); *G02F 1/134309* (2013.01); *G02F 1/136209* (2013.01); *G02F 1/136286* (2013.01); *G06F 3/0443* (2019.05); *G06F 3/04164* (2019.05); *H01L 27/124* (2013.01); *G02F 1/133514* (2013.01)

(58) Field of Classification Search
CPC ........ G06F 3/0443; G06F 3/041; G06F 3/044; G02F 1/1368; G02F 1/13338; H01L 27/124

See application file for complete search history.

(56) References Cited

U.S. PATENT DOCUMENTS 9,329,424 B2 * 5/2016 Chae .................. G02F 1/136286
10,797,082 B2 * 10/2020 Kikuchi .................. H01L 29/45
(Continued)

FOREIGN PATENT DOCUMENTS

WO 2018/008619 A1 1/2018

*Primary Examiner* — Olga V Merkoulova
(74) *Attorney, Agent, or Firm* — ScienBiziP, P.C.

(57) ABSTRACT

An array substrate includes gate lines, source lines, switching components, position detecting electrodes, a light blocking portion, and position detecting lines. The position detecting electrodes are disposed in a layer lower than the gate lines and the source lines to detect input positions at which the position input operation is performed with a position input body based on electrostatic capacitances between the position input body and the position detecting electrodes. The light blocking portion is disposed in a layer lower than channel regions of the switching components and opposite the channel regions with a lower insulating film between the light blocking portion and the channel regions. The position detecting lines are formed from sections of a conductive film from which the light blocking portion is formed and coupled to the position detecting electrodes.

20 Claims, 17 Drawing Sheets

(56) References Cited

U.S. PATENT DOCUMENTS

| | | | | |
|---|---|---|---|---|
| 2013/0271689 | A1* | 10/2013 | Kim | G06F 3/0446 |
| | | | | 349/110 |
| 2016/0062164 | A1* | 3/2016 | Chae | G02F 1/13338 |
| | | | | 349/12 |
| 2018/0143711 | A1* | 5/2018 | Ono | G02F 1/13338 |
| 2019/0064970 | A1* | 2/2019 | Imazeki | G06F 3/041 |
| 2019/0103421 | A1* | 4/2019 | Kikuchi | G06F 3/044 |
| 2019/0324309 | A1* | 10/2019 | Tominaga | G09F 9/30 |
| 2020/0218381 | A1* | 7/2020 | Imazeki | G06F 3/041 |

* cited by examiner

FIG.2
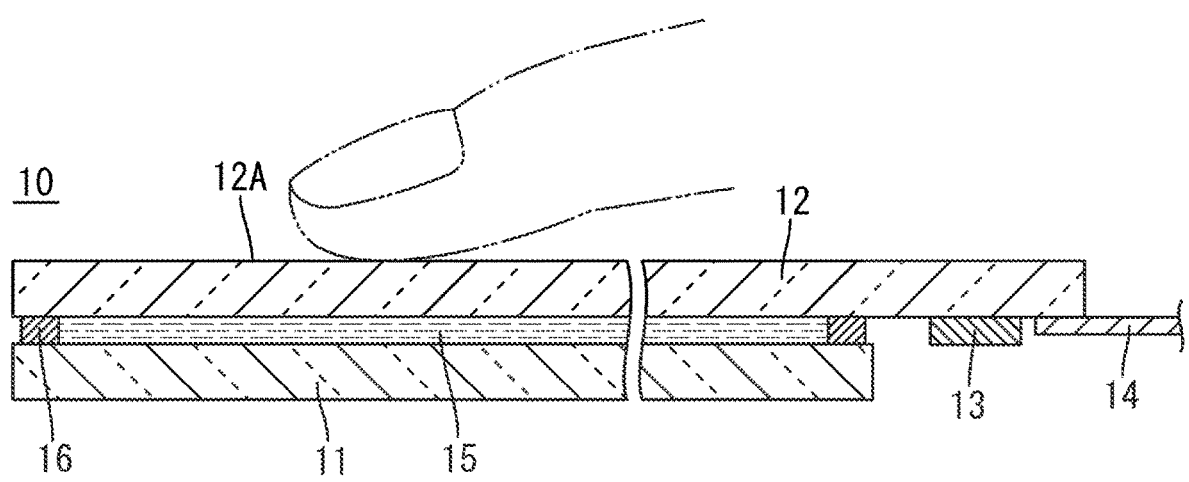
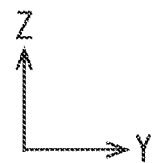

ARRAY SUBSTRATE AND DISPLAY DEVICE

CROSS REFERENCE TO RELATED APPLICATION

This application claims priority from U.S. Provisional Patent Application No. 63/107,813 filed on Oct. 30, 2020. The entire contents of the priority application are incorporated herein by reference.

TECHNICAL FIELD

The present invention relates to an array substrate and a display device.

BACKGROUND

A liquid crystal display device includes an active-matrix substrate, an opposed substrate, and a liquid crystal layer. The liquid crystal layer is between the active-matrix substrate and the opposed substrate. The liquid crystal display device includes a touch surface on an active-matrix substrate side. The active-matrix substrate includes a substrate, pixel electrodes, a common electrode, touch detecting electrodes, and signal lines on a liquid crystal layer side of the substrate. The touch detecting electrodes detect contact with the touch surface. The signal lines are coupled to the touch detecting electrodes, respectively. The pixel electrodes, the common electrode, and the touch detecting electrodes overlap one another when viewed in plan. The touch detecting electrodes are closer to the substrate than the pixel electrodes and a common electrode.

In the active-matrix substrate included in the display device including a touchscreen, the signal lines coupled to the touch detecting electrodes and a black matrix are formed from different films, that is, the display device including the touchscreen tends to have a larger number of films. The number of photomasks required for production of the active-matrix substrate increases and thus a production cost may increase.

SUMMARY

The technology described herein was made in view of the above circumstances. An object is to reduce the number of photomasks.

An array substrate according to the technology described herein includes gate lines, source lines, switching components, position detecting electrodes, a light blocking portion, and position detecting lines. The source lines cross the gate lines. The switching components include gate electrodes, channel regions, source regions, and drain regions. The gate electrodes are coupled to the gate lines. The channel regions are disposed in a layer lower than the gate electrodes and opposite the gate electrodes with a gate insulating film between the gate electrodes and the channel regions. The channel regions are formed from a semiconductor film. The source regions are coupled to the source lines and first ends of the channel regions. The drain regions are coupled to second ends of the channel regions. The position detecting electrodes are disposed in a layer lower than the gate lines and the source lines to detect input positions at which the position input operation is performed with a position input body based on electrostatic capacitances between the position input body and the position detecting electrodes. The light blocking portion is disposed in a layer lower than the channel regions and opposite the channel regions with a lower insulating film between the light blocking portion and the channel regions. The position detecting lines are formed from sections of a conductive film from which the light blocking portion is formed and coupled to the position detecting electrodes.

An array substrate according to the technology described herein includes gate lines, source lines, switching components, position detecting lines, and position detecting electrodes. The source lines cross the gate lines. The switching components include gate electrodes, channel regions, source regions, and drain regions. The gate electrodes are coupled to the gate lines. The channel regions are disposed in a layer lower than the gate electrodes and opposite the gate electrodes with a gate insulating film between the gate electrodes and the channel regions. The channel regions are formed from a semiconductor film. The source regions are coupled to the source lines and first ends of the channel regions. The drain regions are coupled to second ends of the channel regions. The position detecting electrodes are coupled to the position detecting lines to detect input positions at which position input operation is performed with a position input body based on electrostatic capacitances between the position input body and the position detecting electrodes. The position detecting electrodes are formed by reducing resistances of sections of a semiconductor film and in a layer lower than the gate lines and the source lines.

A display device according to the technology described herein includes the array substrate described above and an opposed substrate opposite the array substrate.

According to the technology described herein, the number of photomasks can be reduced.

BRIEF DESCRIPTION OF THE DRAWINGS

FIG. 2 is a cross-sectional view of the liquid crystal panel.

DETAILED DESCRIPTION

First Embodiment

Figure 1:
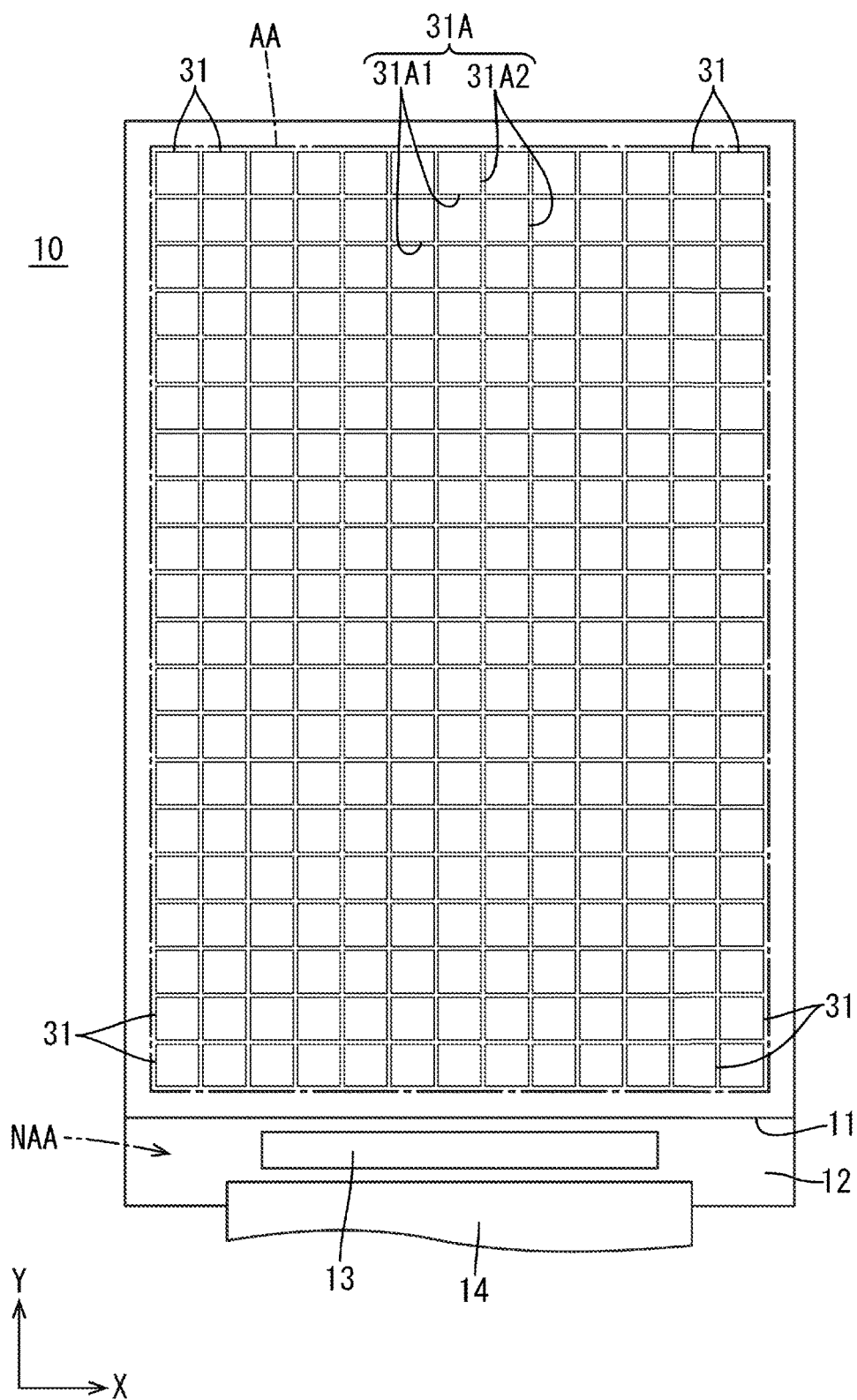
FIG. 1 is a plan view of a liquid crystal panel according to a first embodiment.

A first embodiment will be described in detail with reference to FIGS. 1 to 15. In this section, a liquid crystal panel 10 (a display panel) will be described. In the drawings, X-axes, Y-axes, and Z-axes may be present. The axes in each drawing correspond to the respective axes in other drawings.

FIG. 1 is a plan view schematically illustrating the liquid crystal panel 10. As illustrated in FIG. 1, the liquid crystal panel 10 according to this embodiment has a vertically-long rectangular overall shape in a plan view. A short-side direction, a long-side direction, and a thickness direction of the liquid crystal panel 10 are along the X-axis direction, the Y-axis direction, and the Z-axis direction, respectively. The liquid crystal panel 10 displays images using illumination light emitted by a backlight (a lighting device) on an opposite side from a display surface on which the images are displayed (a user side), that is, behind the liquid crystal panel 10. The liquid crystal panel 10 includes a display area AA (a pixel area) on an inner side of a screen and a non-display area NAA (a frame area) having a frame shape to surround the display area AA on an outer side of the screen. In FIG. 1, the display area AA is surrounded by a chain line.

As illustrated in FIG. 1, the liquid crystal panel includes a pair of glass substrates 11 and 12 being substantially transparent and having light transmissivity. The substrates 11 and 12 include a CF substrate 11 (an opposed substrate) and an array substrate 12 (an active-matrix substrate, a component substrate). The array substrate 12 has a long dimension greater than a long dimension of the CF substrate 11. The array substrate 12 includes an end portion at one of ends with respect to the long-side direction. The end portion is not opposite the CF substrate 11. A driver 13 (a signal source) and a flexible circuit board 14 are mounted on the end portion. The driver 13 includes an LSI chip that includes an internal driver circuit. The driver 13 is mounted in a mounting area of the array substrate 12 using the chip-on-glass (COG) technology. The driver 13 process various signals transmitted by the flexible circuit board 14. The flexible circuit board 14 includes multiple traces (not illustrated) formed on a substrate that is made of a synthetic resin material (such as a polyimide resin) having insulating properties and flexibility. The flexible circuit board 14 includes a first end and a second end coupled to the array substrate 12 and an external control circuit board (a signal source), respectively. Various signals output by the control circuit board are transmitted to the liquid crystal panel 10 via the flexible circuit board 14.

The liquid crystal panel 10 according to this embodiment has a display function for displaying the images and a touchscreen function for detecting input positions at which a user performs position input operation based on the displayed images. The liquid crystal panel 10 includes a touchscreen pattern for performing the touchscreen function. The touchscreen pattern is integrally formed (using the in-cell technology). The touchscreen pattern uses so-called projected capacitive technology, that is, a self-capacitance method for detection. As illustrated in FIG. 1, the touchscreen pattern includes multiple touch electrodes 31 (position detecting electrodes) arranged in a matrix within a plate surface of the liquid crystal panel 10. The touch electrodes 31 are disposed in the display area AA of the liquid crystal panel 10. The display area AA of the liquid crystal panel 10 is about equal to a touch area in which input positions are detectable (a position input area). The non-display area NAA is about equal to a non-touch area in which input positions are not detectable (a non-position input area). When the user moves a position input body closer to the surface of the liquid crystal panel 10 (the display surface) to perform position input operation based on a viewed image in the display area AA of the liquid crystal panel 10, an electrostatic capacitance appears between the position input body and the touch electrode 31. The position input body is an electric conductor such as a finger of the user and a stylus used by the user. The electrostatic capacitance at the touch electrode 31 adjacent to the position input body varies as the position input body approaches. The electrostatic capacitance at the touch electrode 31 defers from an electrostatic capacitance at the touch electrode 31 that is farther from the position input body. The input position is detectable based on the difference. Each touch electrode 31 has a rectangular shape when viewed in plan. Length of edges are some millimeters (e.g., about 2 mm to 6 mm). The touch electrode 31 is significantly larger than a pixel, which will be described later, when viewed in plan. The touch electrode 31 is disposed to straddle multiple pixels in the X-axis direction and the Y-axis direction. Dividing openings 31A (dividing slits) are provided between the touch electrodes 31 adjacent to each other in the X-axis direction and between the touch electrodes 31 adjacent to each other in the Y-axis direction. The dividing openings 31A includes first dividing openings 31A1 that extend in the X-axis direction and second dividing openings 31A2 that extend in the Y-axis direction. The dividing openings 31A form a grid when viewed in plan.

FIG. 2 is a schematic cross-sectional view of the liquid crystal panel 10. As illustrated in FIG. 2, in the liquid crystal panel 10, the CF substrate 11 is disposed on the rear side, that is, closer to the backlight and the array substrate is disposed on the front side, that is, closer to the display side on which the images are displayed (closer to the user). The front plat surface of the array substrate 12 is defined as an input surface 12A on which position input operation is performed with the position input body such as the finger of the user and the stylus used by the user. Polarizing plates are bonded to outer surfaces of the CF substrate 11 and the array substrate 12. Protective films may be bonded to outer surfaces of the polarizing plates. Namely, the position input body is less likely to directly touch the input surface 12A of the array substrate 12.

As illustrated in FIG. 2, the liquid crystal panel 10 includes a liquid crystal layer 15 and a sealant 16. The liquid crystal layer 15 is between the substrates 11 and 12. The sealant 16 is between outer edge sections of the substrates 11 and 12. The liquid crystal layer 15 includes liquid crystal molecules that are substances having optical characteristics that vary according to application of an electric field. The sealant 16 extend an entire periphery of the outer edge sections of the substrates 11 and 12 to surround and seal the liquid crystal layer 15. The sealant 16 has a frame shape (a closed ring shape) when viewed in plan. A cell gap is provided between the substrates 11 and 12. The cell gap is equal to a thickness of the liquid crystal layer 15 and maintained with the sealant 16. The sealant 16 is disposed in the non-display area NAA. The CF substrate 11 and the array substrate 12 include various films that are laminated on inner surfaces of the glass substrates.

Figure 3:
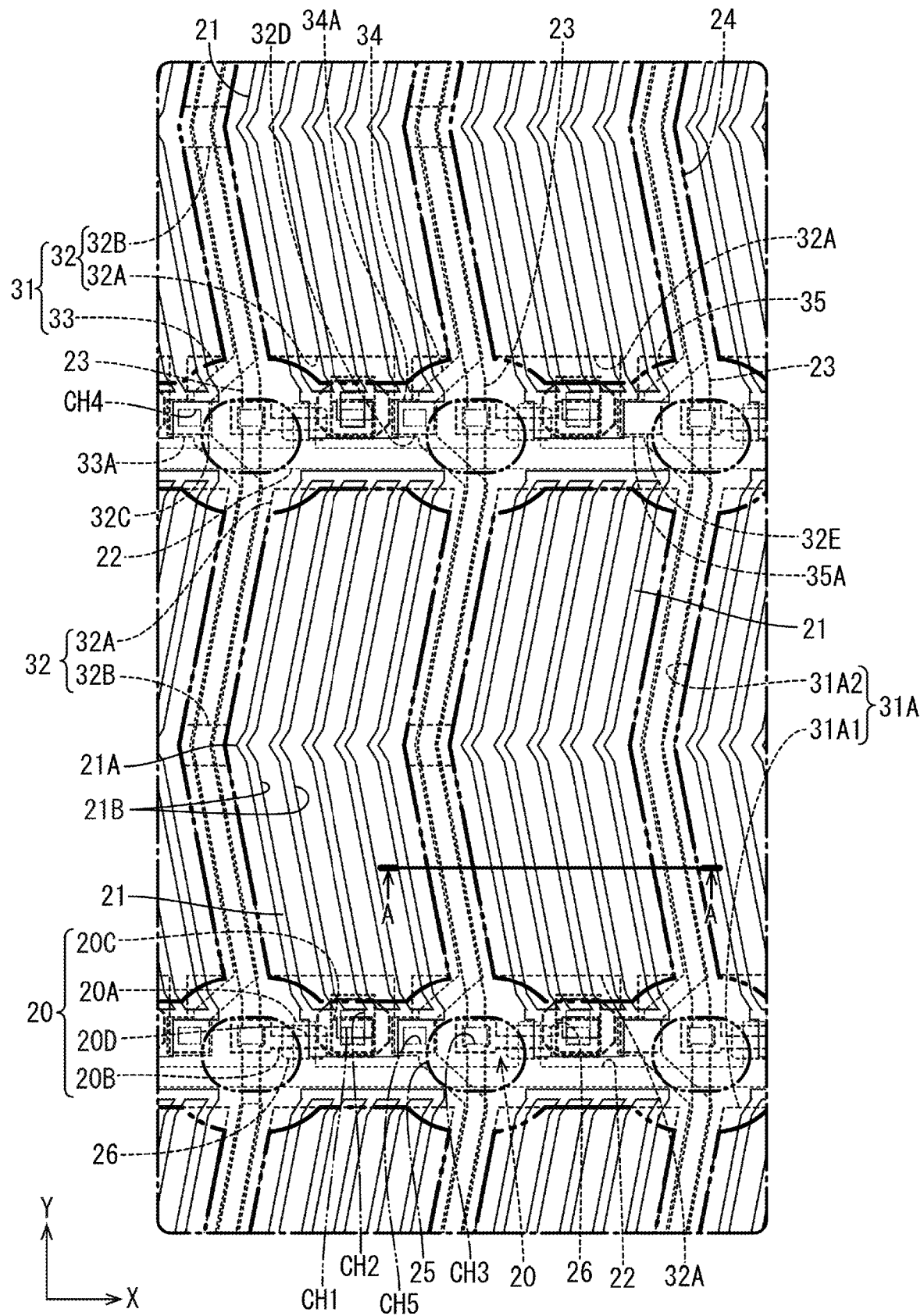
FIG. 3 is a plan view of the liquid crystal panel illustrating arrangement of pixel electrodes in a display area.

FIG. 3 is a plan view of the liquid crystal panel 10 illustrating arrangement of the pixels in the display area AA. As illustrated in FIG. 3, TFTs 20 (switching components, thin film transistors) and pixel electrodes 21 connected to the TFTs 20 are arranged in a matrix on the array substrate 12 in the display area AA. Gate lines 22 (scan lines) and source lines 23 (data lines, signal lines) are disposed in a grid to surround the TFTs 20 and the pixel electrodes 21. The gate lines 22 extend substantially in the X-axis direction for an entire length of the display area AA. Scan signals are input to ends of the gate lines 22. The source lines 23 extend substantially in the Y-axis direction for an entire length of the display area AA. Image signals from the driver 13 are input to ends of the source lines 23. The gate lines 22 are coupled to gate electrodes 20A of the TFTs 20. The source lines 23 are coupled to source regions 20B of the TFTs 20. The pixel electrodes 21 are coupled to drain regions 20C of the TFTs 20. The TFTs 20 are driven based on various signals supplied to the gate lines 22 and the source lines 23. Application of voltages to the pixel electrodes 21 is controlled according to driving of the TFTs 20.

As illustrated in FIG. 3, the pixel electrodes 21 are disposed in vertically-long rectangular areas defined by the gate lines 22 and the source lines 23. The pixel electrodes 21 bend with respect to the long-side direction (a longitudinal direction) of the pixel electrodes 21. Specifically, the pixel electrodes 21 include long edges that are slightly angled relative to the Y-axis direction and bent once at about the middle so that each of the pixel electrodes has a shallow V shape with an obtuse vertex. The pixel electrodes 21 include bending portions 21A at about the middle with respect to the longitudinal direction. Each pixel electrode 21 is sandwiched between two of the gate lines 22 with respect to the Y-axis direction (the long-side direction) and between two of the source lines 23 with respect to the X-axis direction (the short-edge direction). Each source line 23 between the pixel electrodes 21 that are adjacent to each other with respect to the X-axis direction is parallel to the long edges of the pixel electrodes 21 and repeatedly bent in zigzag along the long edges of the pixel electrodes 21. Each pixel electrode 21 includes multiple slits 21B (five in FIG. 2) that extend in the long-edge direction (the Y-axis direction) of the pixel electrode 21. The CF substrate 11 includes a black matrix 24 (an inter-pixel light blocking portion) illustrated with chain double-dashed lines in FIG. 3. The black matrix 24 includes voids that are opposite to the pixel electrodes 21, respectively. Namely, the black matrix 24 has a grid shape. The black matrix 24 are opposite the TFTs 20, the gate lines 22, and the source lines 23. The CF substrate 11 includes spacers illustrated with a chain double-dashed line in FIG. 3 to maintain the thickness of the liquid crystal layer 15 (the cell gap). The spacers 25 are disposed opposite intersections between the gate lines 22 and the source lines 23 when viewed in plan.

Figure 4:
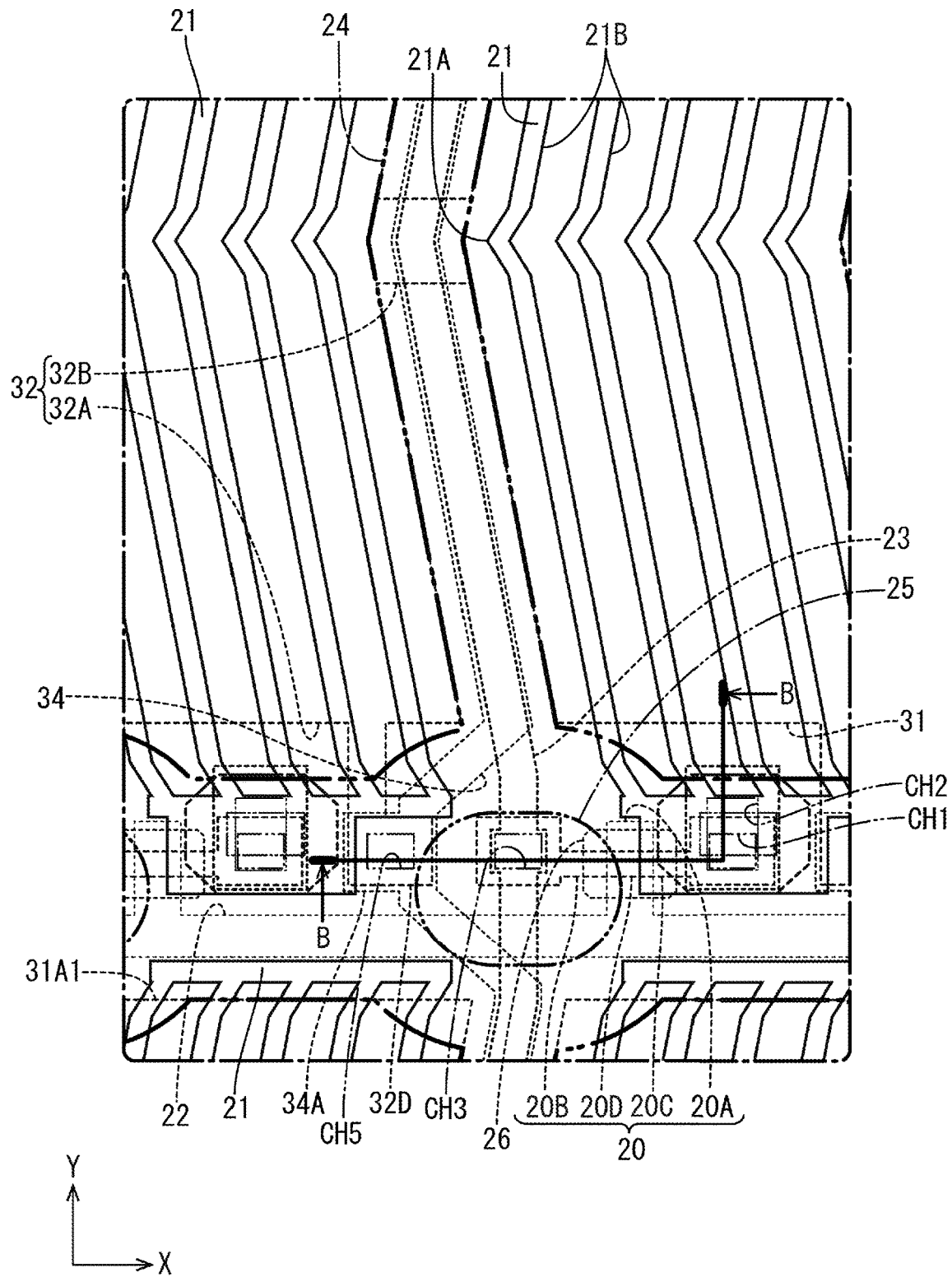
FIG. 4 is a plan view of the liquid crystal panel illustrating a section including TFTs.

FIG. 4 is a plan view of a section of the liquid crystal panel 10 includes the TFT 20 and therearound. A configuration of the TFT 20 will be described in detail with reference to FIG. 4. As illustrated in FIG. 4, the TFT 20 is disposed adjacent to the pixel electrode 21 to which the TFT 20 is coupled below the pixel electrode 21 with respect to the Y-axis direction. The TFT 20 includes the gate electrode 20A that is branched off of the gate line 22. The gate electrode 20A is branched off of the gate line 22 around the intersection between the gate line 22 and the source line 23 to extend in the Y-axis direction. The TFT 20 includes the source region 20B that is coupled to the source line 23. The source region 20B is coupled to a portion of the source line 23 away from the intersection between the source line 23 and the gate line 22 on an upper side in FIG. 4. The source region 20B extends in the X-axis direction. The TFT 20 includes the drain regions 20C that is disposed away from the source region 20B with respect to the Y-axis direction. The drain region 20C extends in the X-axis direction. An end of the drain region 20C on an opposite side to the source region 20B is coupled to the pixel electrode 21. The TFT 20 is disposed in a layer upper than the gate electrode 20A (on a liquid crystal layer 15 side) and opposite the gate electrode 20A. The TFT 20 includes a channel region 20D that continues to the source region 20B and the drain region 20C. Namely, the TFT 20 is a top-gate type transistor. The channel region 20D is between the source region 20B and the drain region 20C. A first end of the channel region 20D continues to the source region 20B. A second end of the channel region 20D continues to the drain region 20C. When the TFT 20 is drive according to the scan signal supplied to the gate line 22 and the gate electrode 20A, the image signal (the voltage) supplied to the source line 23 is transmitted to the drain region 20C from the source region 20B via the channel region 20D. As a result, the pixel electrode 21 is charged to a potential based on the image signal.

As illustrated in FIG. 4, light blocking portions 26 are provided on a lower layer side (an input surface 12A side) relative to the channel regions 20D of the TFTs 20 having the configuration described above, that is, on an opposite side from the gate electrode 20A. The light blocking portions 26 are opposite the channel regions 20D. Each light blocking portion 26 has a horizontally-long shape when viewed in plan such that the light blocking portion 26 extends in the X-axis direction (an extending direction in which the gate lines 22 extend). The light blocking portion 26 is separated from the source line 23, that is, in an island configuration. The light blocking portions 26 block light that may illuminate the channel regions 20D from behind. The light may be ambient light that may enter from the input surface 12A side. Because the light toward the channel regions 20D is blocked by the light blocking portions 26, variations in characteristics of the TFTs 20, which may occur when the channel regions 20D are illuminated with the light, can be reduced.

Figure 5:
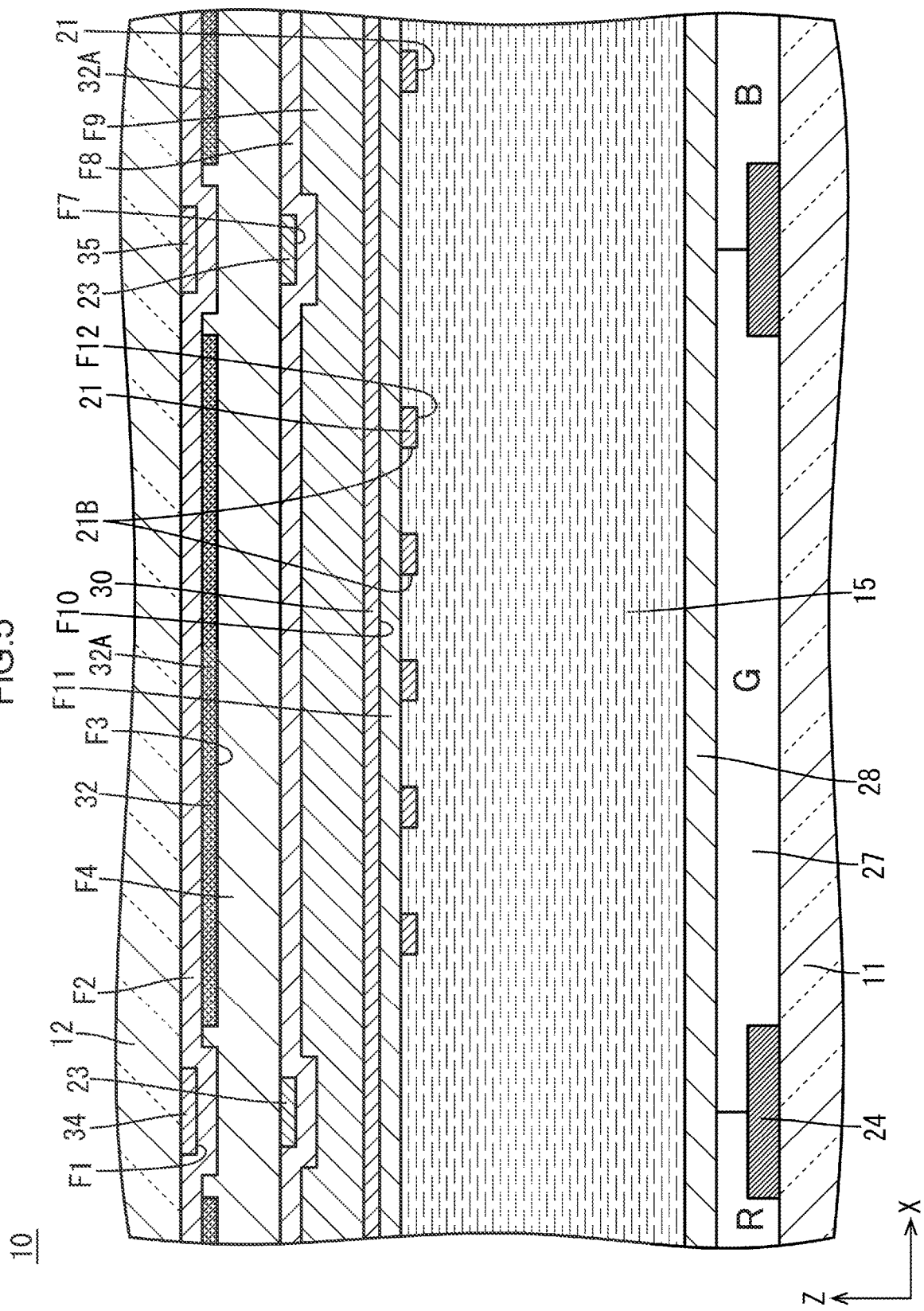
FIG. 5 is a cross-sectional view of the liquid crystal panel along line A-A in FIG. 3.

FIG. 5 is a cross-sectional view of the liquid crystal panel 10 along line A-A in FIG. 3. As illustrated in FIG. 5, multiple color filters 27 are arranged in a matrix on the CF substrate 11 in the display area AA. The color filters 27 are opposite the pixel electrodes 21 on the array substrate, respectively. The color filters 27 include red (R), green (G), and blue (B) color filters repeatedly arranged in a predetermined sequence. Each color filter 27 and corresponding one of the pixel electrodes 21 opposite the color filter 27 are configured as a pixel, which is a display unit. The black matrix 24 is disposed between the adjacent color filters 27 to reduce color mixture. An overcoat film 28 is formed on inner surfaces of the color filter 27 for planarization. The spacers 25 are formed on an inner surface of the overcoat film 28. The spacers 25 project from the inner surface of the CF substrate 11 in the Z-axis direction toward the array substrate 12. Tips of the spacers 25 are in contact with or adjacent to the innermost surface of the array substrate 12. Alignment films are formed on the innermost surfaces of the substrates 11 and 12 to contact the liquid crystal layer 15.

The alignment films are for alignment of the liquid crystal molecules included in the liquid crystal layer 15.

Figure 6:
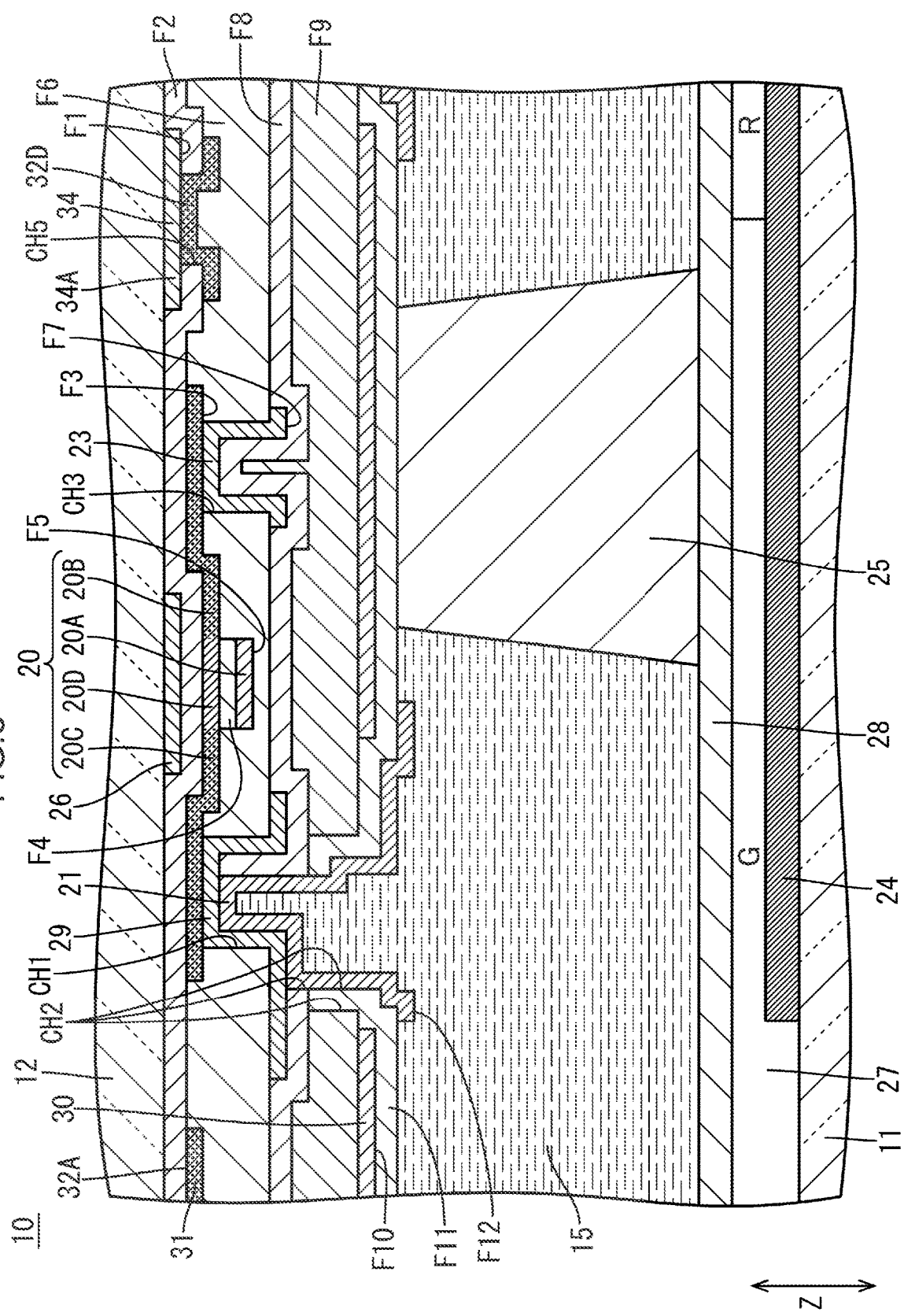
FIG. 6 is a cross-sectional view of the liquid crystal panel along line B-B in FIG. 4.

FIG. 6 is a cross-sectional view of the liquid crystal panel along line B-B in FIG. 4. Films on the inner surface of the array substrate 12 will be described in detail with reference to FIGS. 5 and 6. Specifically, as illustrated in FIGS. 5 and 6, a first metal film F1, a first interlayer insulating film F2 (a lower insulating film), at least a semiconductor film F3, a second interlayer insulating film F4 (a gate insulating film), a second metal film F5, a third interlayer insulating film F6, a third metal film F7, a fourth interlayer insulating film F8, a planarization film F9, a first transparent electrode film F10, a fifth interlayer insulating film F11, a second transparent electrode film F12, and the alignment film are disposed in this sequence from the lower side (the glass substrate side).

The first metal film F1, the second metal film F5, and the third metal film F7 are single-layer film made of one kind of metal that may be selected from copper, titanium, aluminum, molybdenum, and tungsten, multilayer films made of different kinds of metal, or alloys. The first metal film F1, the second metal film F5, and the third metal film F7 have conductivities. As illustrated in FIGS. 5 and 6, the light blocking portions 26 are formed from the first metal film F1. The gate lines 22 and the gate electrodes 20A of the TFTs 20 are formed from the second metal film F5. The source lines 23 and intermediate electrodes 29, which will be described later, are formed from the third metal film F7. The first transparent electrode film F10 and the second transparent electrode film F12 may be made of a transparent electrode material such as indium tin oxide (ITO) and indium zinc oxide (IZO). A common electrode 30, which will be described later, is formed from the first transparent electrode film F10. The pixel electrodes 21 are formed from the second transparent electrode film F12.

The semiconductor film F3 is an oxide semiconductor film made of an oxide semiconductor material. The source regions 20B, the drain regions 20C, and the channel regions 20D of the TFTs 20 are formed from the semiconductor film F3. The material of the semiconductor film F3 may be an In—Ga—Zn—O-based semiconductor (such as indium gallium zinc oxide). The In—Ga—Zn—O-based semiconductor is a ternary oxide including indium (In), gallium (Ga), and zinc (Zn). A ratio of In, Ga, and Zn (composition ratio) may be but not limited to, 2:2:1, 1:1:1, or 1:1:2. The In—Ga—Zn—O-based semiconductor may be an amorphous semiconductor or a crystalline semiconductor. For the crystalline semiconductor, a crystalline In—Ga—Zn—O-base semiconductor having a C axis that is substantially perpendicular to a layer surface is preferable.

The semiconductor film F3 includes resistance-reduced portions and resistance-not-reduced section. Resistances of sections of the semiconductor film F3 are reduced through a resistance reducing process performed in production and defined as the resistance-reduced portions. In FIGS. 5 and 6, the resistance-reduced portions of the semiconductor film F3 are shaded. The resistivity of each resistance-reduced portion of the semiconductor film F3 may be in a range from $1/10000000000$ to $1/100$, which is significantly less than the resistivity of the resistance-non-reduced section, that is, the resistance-reduced portions function as conductors. The source regions 20B and the drain regions 20C of the TFTs 20 may be formed from the resistance-reduced portions of the semiconductor film F3. In the resistance-non-reduced sections of the semiconductor film F3, electric charges are transferrable under specific conditions (when the scan signals are supplied to the gate electrodes 20A). In the resistance-reduced portions, electric charges are always transferrable. Namely, the resistance-reduced portions function as conductors. The channel regions 20D of the TFTs 20 are formed from the resistance-non-reduced sections of the semiconductor film F3.

Steps in the production of the array substrate 12 prior to the resistance reducing process will be briefly described. The semiconductor film F3 is formed and patterned. The second interlayer insulating film F4 and the second metal film F5 are consecutively formed. The second interlayer insulating film F4 and the second metal film F5 are collectively patterned. With remaining sections of the second interlayer insulating film F4 and the second metal film F5 (the gate lines 22 and the gate electrodes 20A) used as a mask, the resistance reducing process is performed on the semiconductor film F3. The resistance reducing process is performed exclusively on sections of the semiconductor film F3 not covered with the remaining sections of the second interlayer insulating film F4 and the second metal film F5 (non-opposite sections, exposed sections). The resistance reducing process is not performed on sections of the semiconductor film F3 covered with the remaining sections of the second interlayer insulating film F4 and the second metal film F5 (opposite sections, non-exposed sections). Examples of the resistance reducing process include plasma processing using $NH_3$ gas, $N_2$ gas, or He gas and annealing processing.

The first interlayer insulating film F2, the second interlayer insulating film F4, the third interlayer insulating film F6, the fourth interlayer insulating film F8, and the fifth interlayer insulating film F11 are made of oxide silicon or silicon oxide ($SiO_2$) or silicon nitride ($SiN_x$), which is a kind of inorganic insulating materials (inorganic resin materials). The planarization film F9 is made of PMMA (acrylic resin), which is a kind of organic insulating materials (organic resin materials). As illustrated in FIGS. 5 and 6, the first interlayer insulating film F2 is disposed between the first metal film F1 and the semiconductor film F3 to insulate the first metal film F1 from the semiconductor film F3. The second interlayer insulating film F4 is disposed between the semiconductor film F3 and the second metal film F5 to insulate the semiconductor film F3 from the second metal film F5. Gaps between the gate electrodes 20A and the channel regions 20D are maintained constant with sections of the second interlayer insulating film F4 opposite the gate electrodes 20A. The third interlayer insulating film F6 is disposed between the semiconductor film F3 and the third metal film F7 and between the second metal film F5 and the third metal film F7 to insulate the semiconductor film F3 and the second metal film F5 from the third metal film F7. Sections of the third interlayer insulating film F6 between the intersections of the gate lines 22 formed from the second metal film F5 and the source lines 23 formed from the third metal film F7 insulate the gate lines 22 from the source lines 23. Therefore, the third interlayer insulating film F6 may be referred to as an interline insulating film.

As illustrated in FIGS. 5 and 6, the third interlayer insulating film F6 includes first pixel contact holes CH1 at positions opposite both the drain regions 20C of the TFTs 20 and the pixel electrodes 21. The intermediate electrodes 29 formed from the third metal film F7 are disposed opposite the first pixel contact holes CH1. The intermediate electrodes 29 having island shapes are disposed opposite the first pixel contact holes CH1 and coupled to the drain regions 20C of the TFTs 20 via through the first pixel contact holes CH1. The fourth interlayer insulating film F8 and the planarization film F9 are disposed between the third metal film F7 and the first transparent electrode film F10 to insulate the third metal film F7 from the first transparent electrode film F10. The fifth interlayer insulating film F11 is disposed between the first transparent electrode film F10 and the second transparent electrode film F12 to insulate the first transparent electrode film F10 from the second transparent electrode film F12. The fifth interlayer insulating film F11 functions as an interelectrode insulating film. The fourth interlayer insulating film F8, the planarization film F9, and the fifth interlayer insulating film F11 include second pixel contact holes CH2 at positions opposite both sections of the pixel electrodes 21 and the intermediate electrodes 29. The pixel electrodes 21 are coupled to the intermediate electrodes through the second pixel contact holes CH2. The drain regions 20C of the TFTs 20 are electrically connected to the pixel electrodes 21 via the intermediate electrodes 29 that are disposed between the drain regions 20C and the pixel electrodes 21. Because the drain regions 20C are covered with the intermediate electrodes 29 formed from the third metal film F7, the intermediate electrodes 29 function as etching stopper during patterning the first transparent electrode film F10 to form the common electrode 30. Therefore, the drain regions 20C are less likely to be overly etched. The third interlayer insulating film F6 includes source line contact holes CH3 at positions opposite both the source regions 20B of the TFTs 20 and the source lines 23. The source lines 23 are coupled to the source regions 20B through the source line contact holes CH3. The spacers 25 are opposite the source line contact holes CH3.

Figure 7:
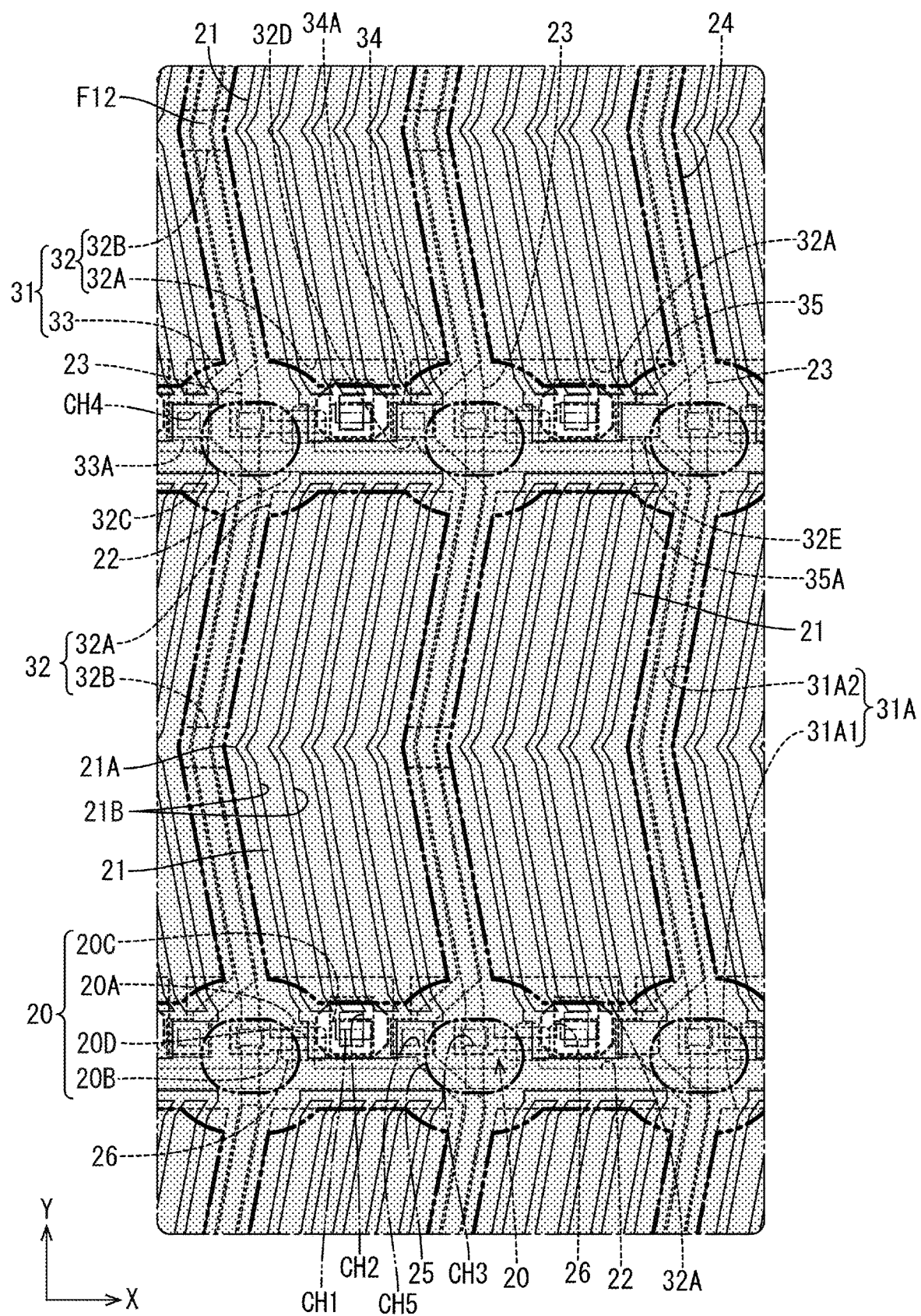
FIG. 7 is a plan view illustrating a pattern of a first transparent electrode film in the liquid crystal panel.

Next, the common electrode 30 will be described with reference to FIGS. 5 to 7. FIG. 7 is a plan view illustrating a pattern of the first transparent electrode film F10 (the common electrode 30) included in the array substrate 12. In FIG. 6, sections of the first transparent electrode film F10 are shaded. As illustrated in FIGS. 5 to 7, the common electrode 30 is a solid pattern that spreads in at least an about entire area of the display area on the array substrate 12. The common electrode 30 is disposed under all of the pixel electrodes 21 with the fifth interlayer insulating film F11 between the common electrode 30 and the pixel electrodes 21. The common electrode 30 includes voids at positions opposite the intermediate electrodes 29 and the pixel contact holes CH1 and CH2 to connect the pixel electrodes 21 in an upper layer to the intermediate electrodes 29 in a lower layer. A common voltage signal (a reference voltage signal) is supplied to the common electrode 30 and a potential of the common electrode 30 is held at a common potential (a reference potential). When the TFTs 20 are driven and the pixel electrodes 21 are charged to potentials defined by image signals transmitted by the source lines 23, potential differences are created between the pixel electrodes 21 and the common electrode 30. Fringe electric fields (orthogonal electric fields) including components parallel to the plate surface of the array substrate and components normal to the plate surface of the array substrate 12 may be created between the common electrode 30 and opening edges of the slits 21B of the pixel electrodes 21. Using the fringe electric fields, orientations of the liquid crystal molecules in the liquid crystal layer 15 can be controlled and thus predefined images can be displayed based on the orientations of the liquid crystal molecules. Namely, the liquid crystal panel 10 that includes the array substrate 12 according to this embodiment operates in fringe field switching (FFS) mode.

Figure 8:
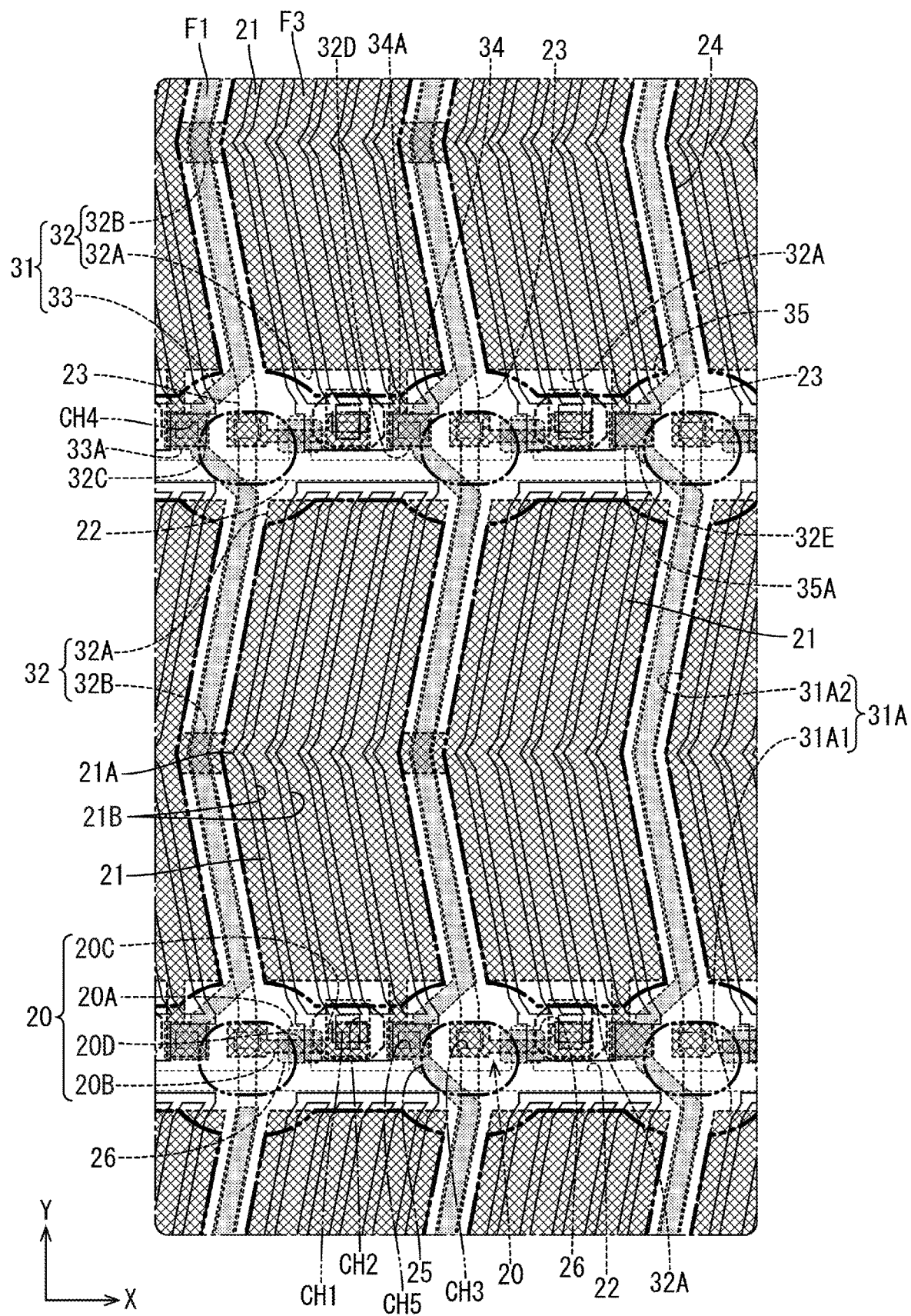
FIG. 8 is a plan view illustrating patterns of the first metal film and a semiconductor film in the liquid crystal panel.
Figure 9:
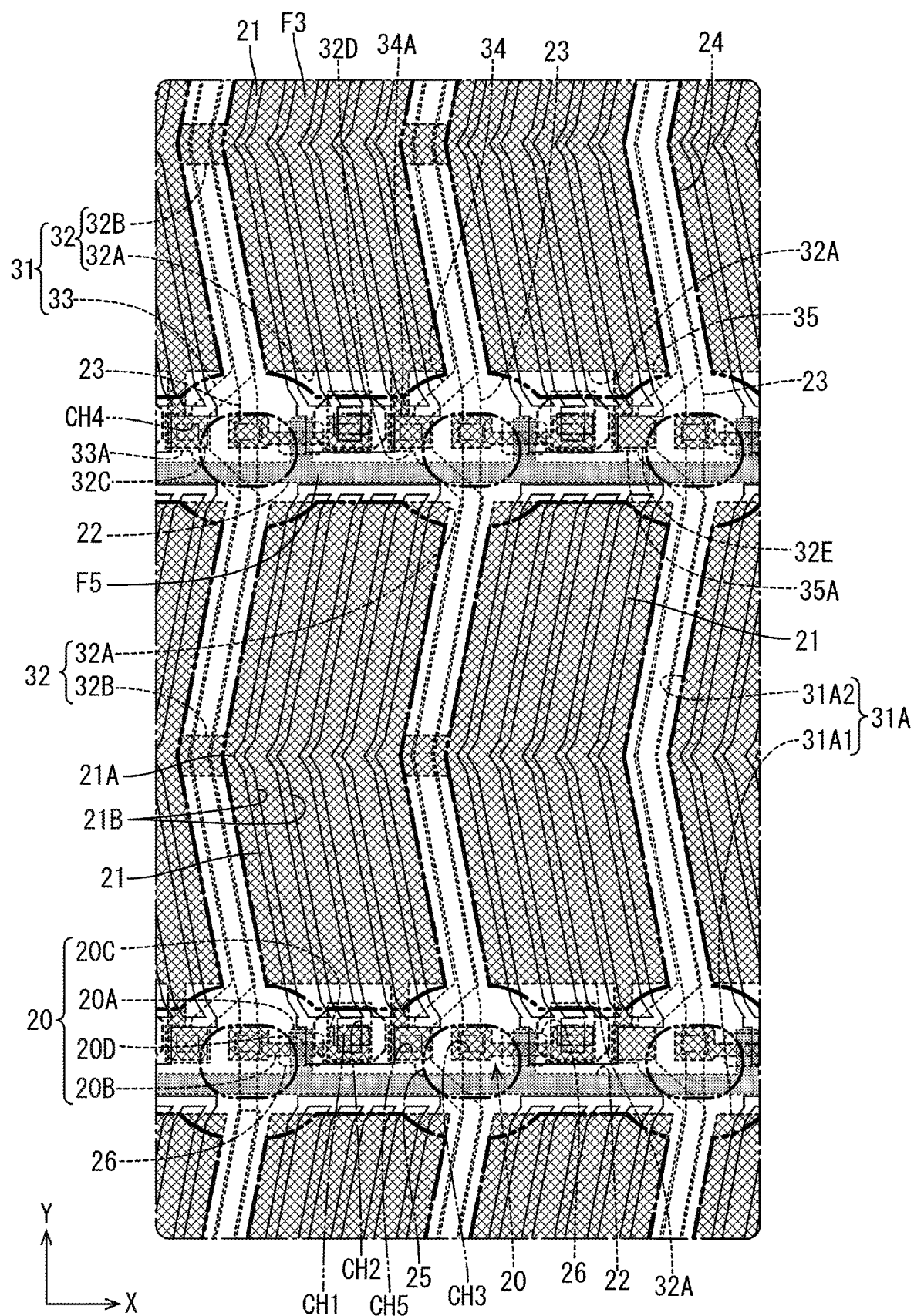
FIG. 9 is a plan view illustrating the pattern of the semiconductor film and a pattern of a second metal film in the liquid crystal panel.

Next, the touch electrodes 31 will be described with reference to FIGS. 5, 6 and 8 to 15 where appropriate. FIG. 8 is a plan view illustrating patterns of the first metal film F1 and the semiconductor film F3 included in the array substrate 12. In FIG. 8, sections of the first metal film F1 and the semiconductor film F3 are shaded with different shading patterns. FIG. 9 is a plan view illustrating patterns of the semiconductor film F3 and the second metal film F5 included in the array substrate 12. In FIG. 9, sections of the semiconductor film F3 and the second metal film F5 are shaded with different shading patterns.

As illustrated in FIGS. 5, 8, and 9, the touch electrodes 31 are disposed in a layer of the array substrate 12 different from the common electrode 30 (the first transparent electrode film F10). Specifically, large portions of the touch electrodes 31 are formed from the resistance-reduced portions 32 that are prepared by reducing the resistances of sections of the semiconductor film F3. The resistance-reduced portions 32 extend in the X-axis direction to straddle multiple pixel electrodes 21 that are arranged in the X-axis direction. The resistance-reduced portions 32 are arranged at intervals in the Y-axis direction. Between the resistance-reduced portions 32 adjacent to each other in the Y-axis direction, corresponding one of the gate lines 22 is disposed. Namely, the resistance-reduced portions 32 do not straddle (or overlap) the gate lines 22. If the semiconductor film F3 from which the resistance-reduced portions 32 are formed include sections that are opposite the gate lines 22 that are formed from the second metal film F5, the sections may be masked by the gate lines and thus the resistance reducing process may not be performed on the sections, that is, the resistances of the sections may not be reduced (conductivity of the sections may not be increased). The number of the resistance-reduced portions 32 included in one touch electrode 31 is equal to the number of the pixel electrodes 21 that are arranged in the Y-axis direction in an area in which the touch electrode 31 is formed.

As illustrated in FIGS. 8 and 9, each resistance-reduced portion 32 extends in the X-axis direction and straddles multiple pixel electrodes 21. The resistance-reduced portion 32 includes a narrow section that crosses corresponding one of the source lines 23 (a joint section 32B, which will be described later). Specifically, each resistance-reduced portion 32 includes multiple pixel electrode opposite sections 32A and the joint section 32B. The pixel electrode opposite sections 32A are opposite at least sections of the pixel electrodes 21 that are arranged in the X-axis direction. The joint section 32B is coupled to the pixel electrode opposite sections 32A that are adjacent to each other. The pixel electrode opposite sections 32A have a bent shape that bends along the pixel electrodes 21 when viewed in plan. The pixel electrode opposite sections 32A are opposite large areas of the pixel electrodes 21. A dimension of the pixel electrode opposite sections 32A in the X-axis direction is greater but a dimension in the Y-axis direction is less in comparison to the pixel electrodes 21. The pixel electrode opposite sections 32A do not include slits such as slits of the pixel electrodes 21. The expression "pixel opposite sections" is used because the pixel opposite sections 32A are sections of the resistance-reduced portions 32 that are opposite the pixel electrodes 21. However, the expression does not exclude a configuration that the pixel electrode opposite sections 32A include sections that are not opposite the pixel electrodes 21 (e.g., sections opposite the slits 21B). The number of the pixel electrode opposite sections 32A included in each resistance-reduced portion 32 is equal to the number of the pixel electrodes 21 that are arranged in the X-axis direction in an area in which the touch electrodes 31 are formed. As illustrated in FIG. 5, the pixel electrode opposite sections 32A formed from the semiconductor film F3 are opposite the pixel electrodes 21 formed from the second transparent electrode film F12 with the third interlayer insulating film F6, the fourth interlayer insulating film F8, the planarization film F9, and the fifth interlayer insulating film F11 between the pixel electrode opposite sections 32A and the pixel electrodes 21.

As illustrated in FIGS. 8 and 9, each joint section 32B extends from one of the pixel electrode opposite sections 32A that are adjacent to each other in the X-axis direction toward another one of the pixel electrode opposite sections 32A to cross the corresponding source line 23 that is disposed between the adjacent pixel electrode opposite sections 32A. A dimension of the joint section 32B in the Y-axis direction (an extending direction in which the source line 23 extends) is less in comparison to the pixel electrode opposite sections 32A. Specifically, the dimension of the joint section 32B in the Y-axis direction is slightly greater than a width of the gate line 22 or the source line 23. The joint section 32B is disposed opposite the bending portion 21A of the pixel electrode 21 with respect to the Y-axis direction and coupled to the middle sections of the pixel electrode opposite sections 32A with respect to the longitudinal direction. The number of the joint sections 32B included in each resistance-reduced portion 32 is less than the number of the pixel electrode opposite sections 32A in the resistance-reduced portion 32 by one. The joint sections 32B formed from the semiconductor film F3 are opposite the source lines formed from the third metal film F7 with the third interlayer insulating film F6 between the joint sections 32B and the source lines 23.

Figure 10:
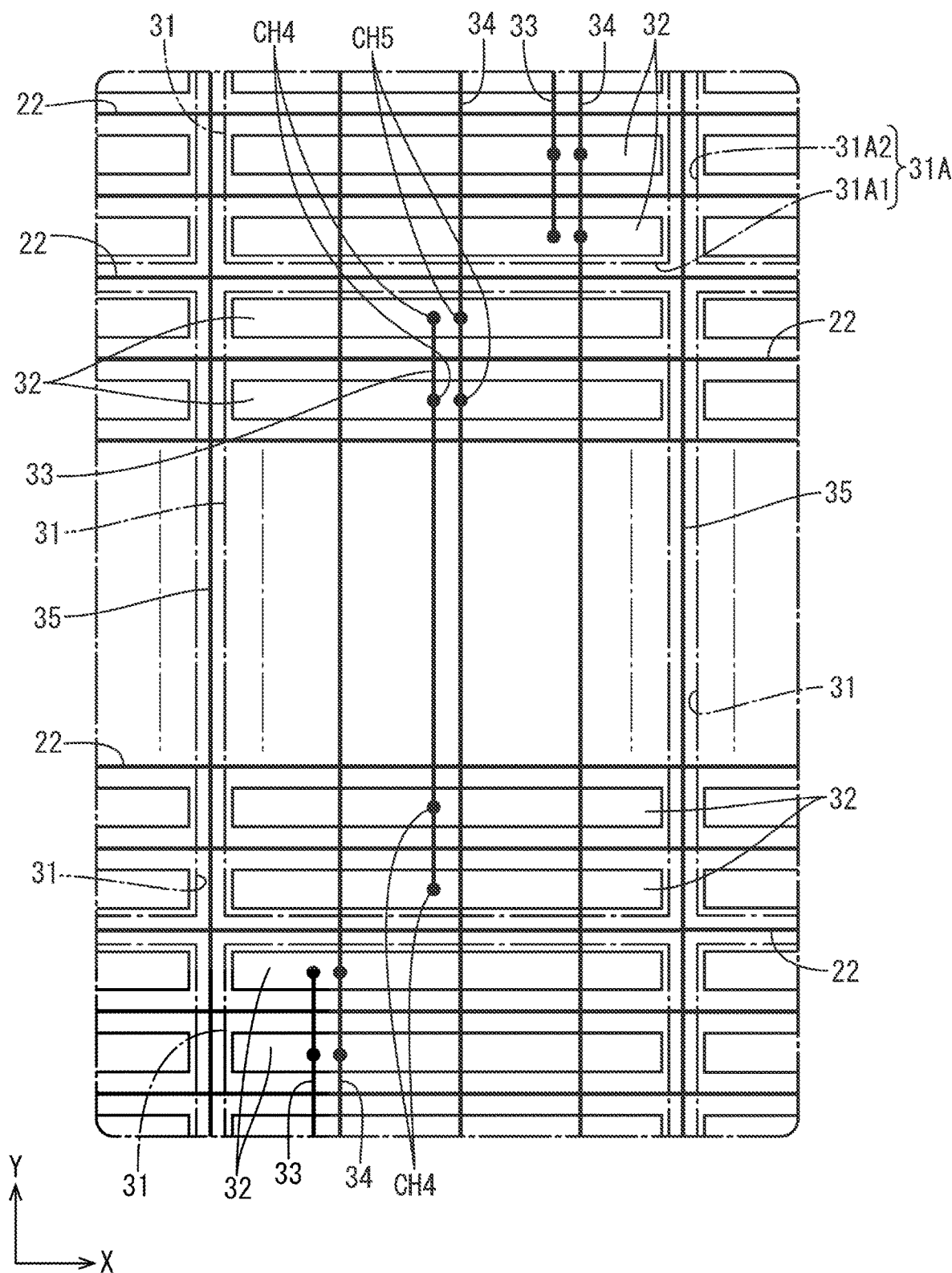
FIG. 10 is a schematic view illustrating a configuration of touch electrodes, touch lines, and dummy touch lines in the liquid crystal panel.

As illustrated in FIG. 10, the touch electrodes 31 include (inter-resistance-reduced portion shorting portions) that are coupled to the resistance-reduced portions 32 to cause short-circuit between the resistance-reduced portions 32 that arranged in the Y-axis direction. FIG. 10 is a schematic view illustrating a configuration of the touch electrode 31 in the liquid crystal panel 10. In FIG. 10, the source lines 23 are not illustrated for better visibility. Further, FIG. 10 illustrates the planar shape of the resistance-reduced portion with exaggeration, which is simple vertically-long rectangular. The coupling portions 33 extend in the Y-axis direction as a whole to straddle multiple resistance-reduced portions 32 that are arranged in the Y-axis direction and the gate lines 22 between the resistance-reduced portions 32 that are adjacent to each other in the Y-axis direction. Each coupling portion 33 straddles all of the resistance-reduced portions 32 included in one touch electrode 31. The couple portion 33 is coupled to the all of the resistance-reduced portions 32. Therefore, the all of the resistance-reduced portions 32 in one touch electrode 31 are maintained at the same potential. Each coupling portion 33 does not straddle the touch electrodes 31 that are adjacent to each other in the Y-axis direction. Namely, the coupling portion 33 does not exist in the first dividing opening 31A1 between the touch electrodes 31 that are adjacent to each other in the Y-axis direction.

As illustrated in FIGS. 8 and 9, a large portion of each coupling portion 33 is between the pixel electrodes 21 that are adjacent to each other in the X-axis direction. The large portion of the coupling portion 33 are opposite the source line 23. The coupling portions 33 are formed from the first metal film F1 that is a conductive film from which the light blocking portions 26 are formed. Therefore, the coupling portions 33 are opposite the source lines 23 that are formed from the third metal film F7 with the first interlayer insulating film F2 and the third interlayer insulating film F6 between the coupling portion 33 and the source lines 23 (see FIG. 5). The coupling portions 33 cross the joint sections 32B that are included in the resistance-reduced portions 32. The first interlayer insulating film F2 is between the coupling portions 33 and the joint sections 32B (the semiconductor film F3).

Figure 11:
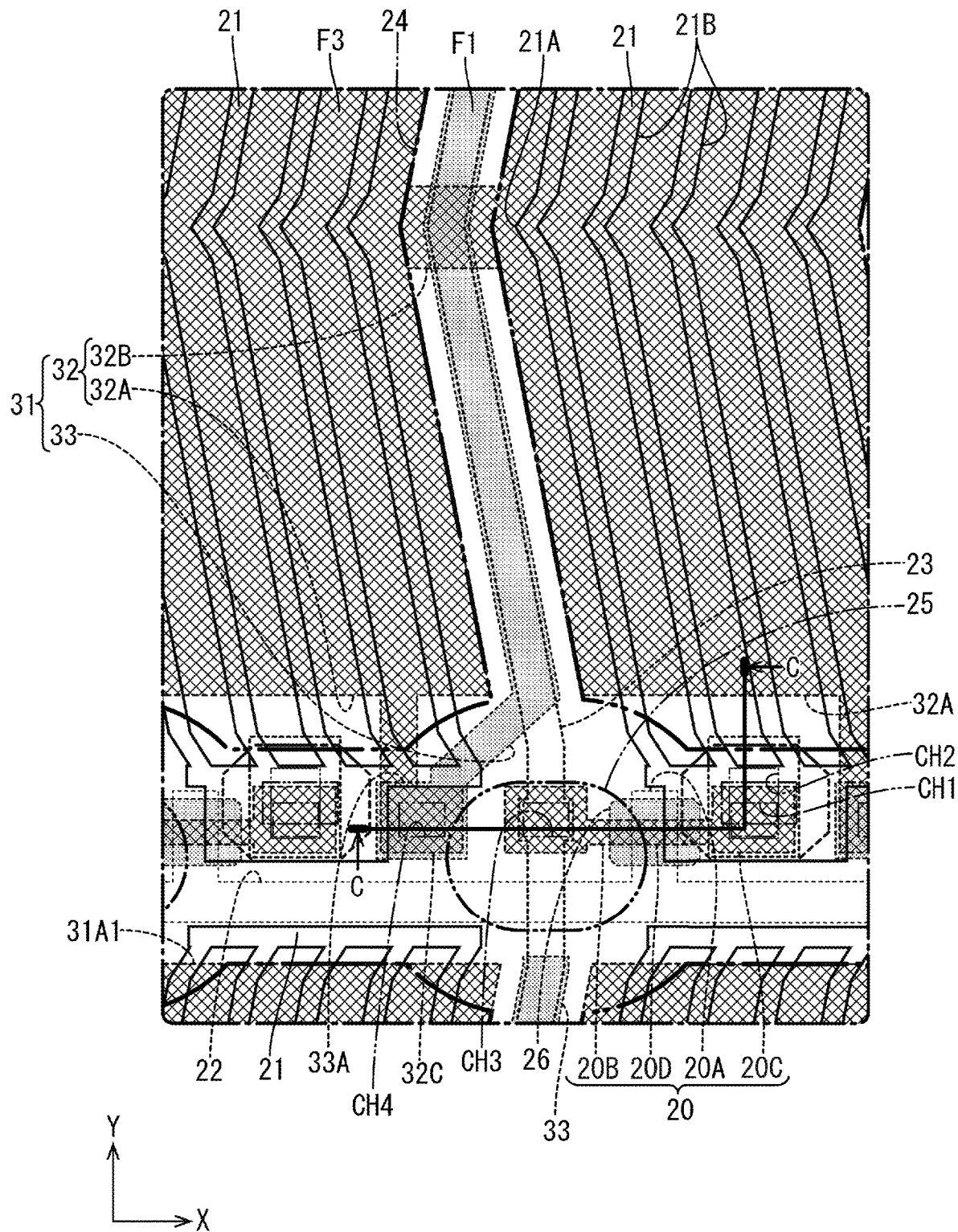
FIG. 11 is a plan view of illustrating sections of the first metal film and the semiconductor film at intersections and therearound in the liquid crystal panel.
Figure 12:
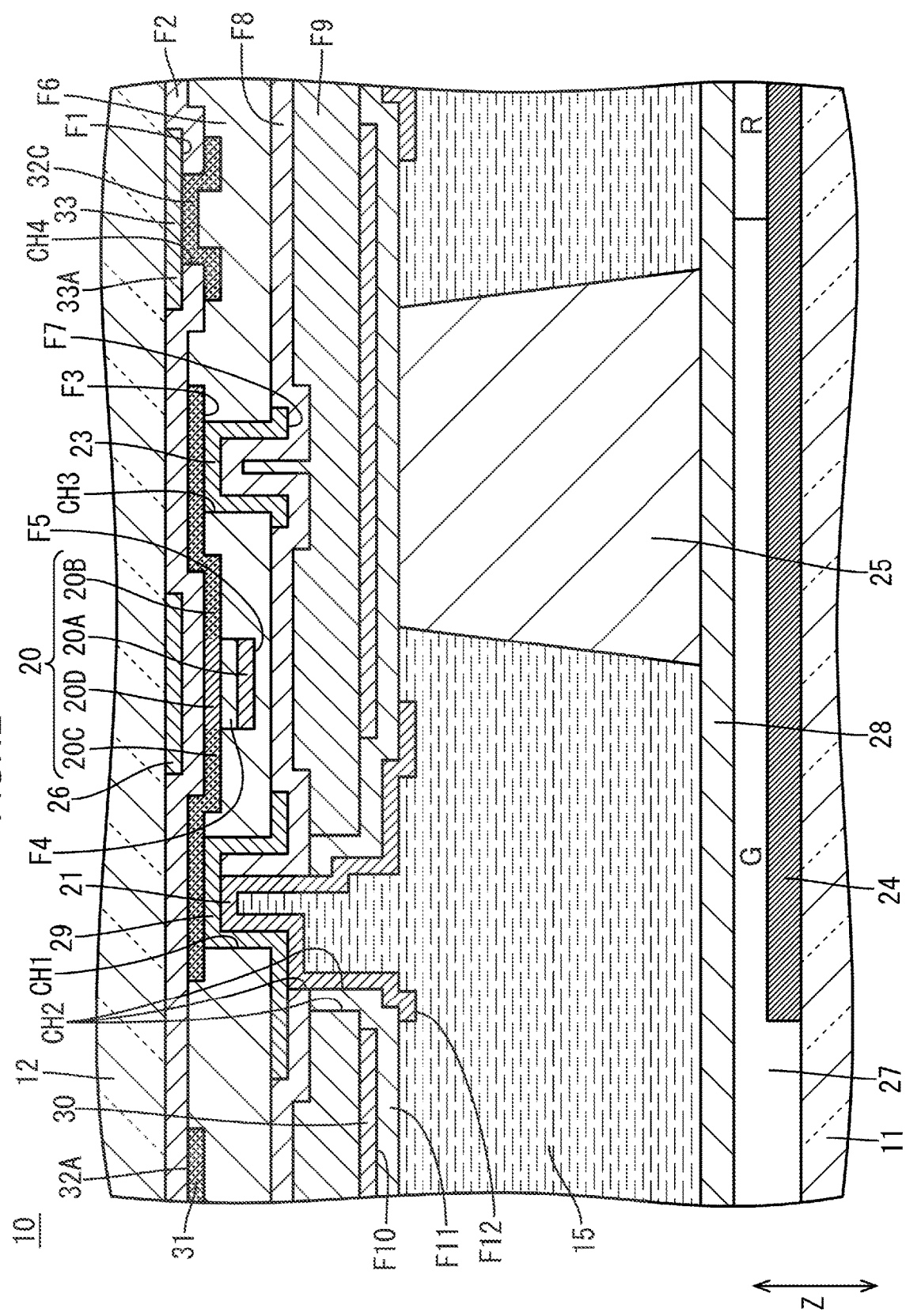
FIG. 12 is a cross-sectional view of the liquid crystal panel along line C-C in FIG. 11.

As illustrated in FIGS. 8 and 9, sections of the coupling portions 33 crossing the gate lines 22 are curved toward the left to go around the TFTs 20. The curved sections are not opposite the source lines 23. As illustrated in FIG. 11, the coupling portions 33 include coupling portion-side contacts 33A in the curved sections. The coupling portion-side contacts 33A are coupled to the resistance-reduced portions 32. FIG. 11 is a plan view illustrating sections of patterns of the first metal film F1 and the semiconductor film F3 at the coupling portions 33 and therearound in the liquid crystal panel 10. In FIG. 11, sections of the first metal film F1 and the semiconductor film F3 are shaded with different shading patterns. The coupling portion-side contacts 33A are formed by widening sections of the coupling portions 33. The resistance-reduced portions 32 include first resistance-reduced portion-side contacts 32C that are disposed opposite the coupling portion-side contacts 33A and coupled to the coupling portion-side contacts 33A. The first resistance-reduced portion-side contacts 32C project downward in FIG. 11 from the pixel electrode opposite sections 32A in the Y-axis direction. Distal ends of the first resistance-reduced portion-side contacts 32C having a greater width are opposite the coupling portion-side contacts 33A. The coupling portion-side contacts 33A and the first resistance-reduced portion-side contacts 32C are positioned opposite the joints between the source lines 23 and the source regions 20B (the source line contact holes CH3) or the joints between the pixel electrodes 21 and the drain regions 20C (the pixel contact holes CH1, CH2). The first interlayer insulating film F2 between the coupling portion-side contacts 33A that are formed from the first metal film F1 and the first resistance-reduced portion-side contacts 32C that are formed from the semiconductor film F3 include coupling portion contact holes CH4 as illustrated in FIGS. 11 and 12. The coupling portion-side contacts 33A are coupled to the first resistance-reduced portion-side contacts 32C through the coupling portion contact holes CH4. FIG. 12 is a cross-sectional view of the liquid crystal panel 10 along line C-C in FIG. 11. The coupling portion contact holes CH4 are opposite both the coupling portion-side contacts 33A and the first resistance-reduced portion-side contacts 32C. Further, the spacers 25 are opposite sections of the coupling portion-side contacts 33A and the first resistance-reduced portion-side contacts 32C.

As illustrated in FIG. 10, the array substrate 12 includes touch lines 34 (position detecting lines) coupled to the touch electrodes 31 having the configuration described above. The touch lines 34 extend in the Y-axis direction for substantially an entire length of the display area AA. Touch signals (position detecting signals) output by the driver 13 are input to ends of the touch lines 34. The touch lines 34 are selectively coupled to specified touch electrodes 31 of the touch electrodes 31 that are arranged in the Y-axis direction in the display area AA. Each touch line 34 is coupled to all of the resistance-reduced portions 32 included in the touch electrode 31 that is a target to be connected. According to the configuration, the touch signals transmitted through the touch line 34 are supplied to all of the resistance-reduced portions 32 in the touch electrode 31. Each touch line 34 straddles the touch electrodes 31 that are adjacent to each other in the Y-axis direction and cross the first dividing opening 31A1 between the touch electrodes 31 that are adjacent to each other in the Y-axis direction.

As illustrated in FIGS. 8 and 9, a large portion of each touch line 34 is between the pixel electrodes 21 that are adjacent to each other in the X-axis direction. The large portion of the touch line 34 are opposite the source line 23. The touch lines 34 are formed from the first metal film F1 that is the conductive film from which the light blocking portions and the coupling portions 33 are formed. Therefore, the touch lines 34 are opposite the source lines 23 that are formed from the third metal film F7 with the first interlayer insulating film F2 and the third interlayer insulating film F6 between the touch lines 34 and the source lines 23 (see FIG. 5). The first interlayer insulating film F2 is between the touch lines 34 and the gate lines 22 (the second metal film F5) that are crossed by the touch lines 34. The touch lines 34 cross the joint sections 32B that are included in the resistance-reduced portions 32. The first interlayer insulating film F2 is between the touch lines 34 and the joint sections 32B (the semiconductor film F3).

Figure 13:
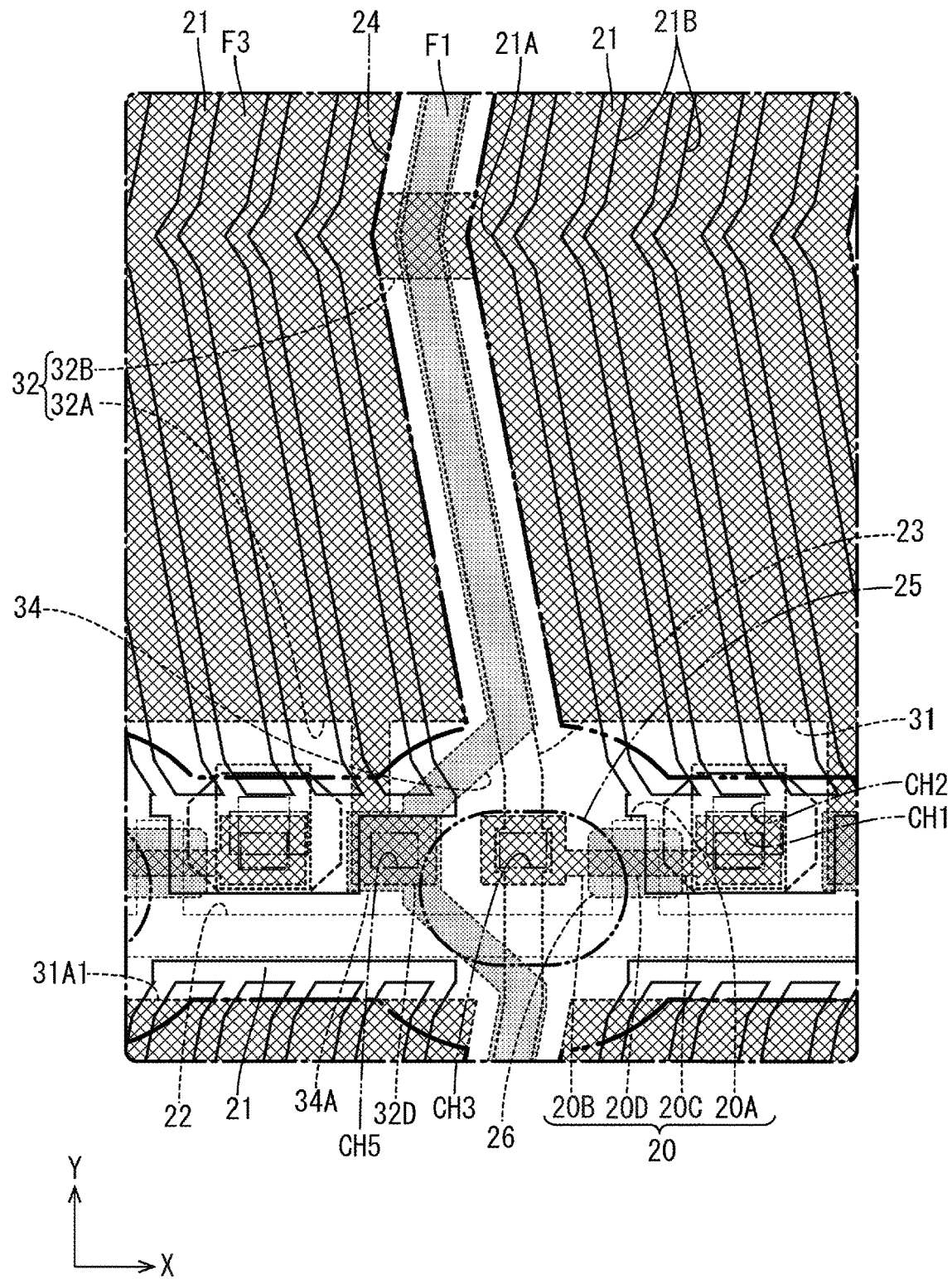
FIG. 13 is a plan view illustrating sections of the pattern of the first metal film and the semiconductor film around the touch line in the liquid crystal panel.

As illustrated in FIGS. 8 and 9, the touch lines 34 are routed similarly to the coupling portions 33 in the display area AA. More specifically, sections of the touch lines 34 crossing the gate lines 22 are curved toward the left in FIGS. 8 and 9 to go around the TFTs 20. The curved sections of the touch lines 34 are not opposite the source lines 23. As illustrated in FIG. 13, the touch lines 34 include touch line-side contacts 34A in the curved sections. The touch line-side contacts 34A are coupled to the resistance-reduced portions 32. FIG. 13 is a plan view of the liquid crystal panel 10 illustrating patterns of the first metal film F1 and the semiconductor film F3 around the touch lines 34. In FIG. 13, sections of the first metal film F1 and the semiconductor film F3 are shaded with different shading patterns. The touch line-side contacts 34A are formed by widening sections of the touch lines 34. The resistance-reduced portions 32 include second resistance-reduced portion-side contacts 32D that are disposed opposite the touch line-side contacts 34A and coupled to the touch line-side contacts 34A. The second resistance-reduced portion-side contacts 32D extend downward in FIG. 13 from the pixel electrode opposite sections 32A. The second resistance-reduced portion-side contacts 32D include distal ends having a greater width and being opposite the touch line-side contacts 34A. The touch line-side contacts 34A and the second resistance-reduced portion-side contacts 32D are positioned opposite the joints between the source lines 23 and the source regions 20B (the source line contact holes CH3), the joints between the pixel electrodes 21 and the drain regions 20C (the pixel contact holes CH1, CH2), or the joints between the resistance-reduced portions 32 and the coupling portions 33 (the coupling portion contact holes CH4) (see FIGS. 8 and 9). As illustrated in FIGS. 6 and 13, the first interlayer insulating film F2 between the touch line-side contacts 34A that are formed from the first metal film F1 and the second resistance-reduced portion-side contacts 32D that are formed from the semiconductor film F3 includes touch line contact holes CH5. The touch line-side contacts 34S are coupled to the second resistance-reduced portion-side contacts 32D through the touch line contact holes CH5. The touch line contact holes CH5 are opposite both the touch line-side contacts 34A and the second resistance-reduced portion-side contacts 32D. Further, the spacers 25 are opposite sections of the touch line-side contacts 34A and the second resistance-reduced-portion-side contacts 32D. The touch lines 34 are in pattern (a planar shape) similar to the pattern of the coupling portions 33 except that the touch lines 34 cross the first dividing openings 31A1. The touch lines 34 include touch line-side dummy contacts that are opposite the second resistance-reduced portion-side contacts 32D of the resistance-reduced portions 32 included in the touch electrodes 31 that are targets to be coupled. The touch line-side dummy contacts are in planar pattern similar to the pattern of the touch line-side contacts 34A.

As illustrated in FIG. 10, the array substrate 12 includes dummy touch lines 35 (dummy position detecting lines) that are not coupled to any touch electrodes 31. The dummy touch lines 35 extend in the Y-axis direction for substantially an entire length of the display area AA. Common signals (reference voltage signals) output by the driver 13 are input to ends of the dummy touch lines 35. Each dummy touch line 35 is disposed between the touch electrodes 31 that are adjacent to each other in the X-axis direction and in the second dividing opening 31A2.

As illustrated in FIGS. 8 and 9, a large portion of each dummy touch line 35 is disposed between the pixel electrodes 21 that are adjacent to each other in the X-axis direction. The large portion of the dummy touch line 35 are opposite the source line 23. The dummy touch lines 35 are formed from the first metal film F1 that is a conductive film from which the light blocking portions 26, the coupling portions 33, and the touch lines 34 are formed. The dummy touch lines 35 are opposite the source lines 23 that are formed from the third metal film F7 with the first interlayer insulating film F2 and the third interlayer insulating film F6 between the dummy touch lines 35 and the source lines 23 (see FIG. 5). The first interlayer insulating film F2 is between the dummy touch lines 35 and the gate lines 22 (the second metal film F5). The dummy touch lines 35 cross the gate lines 22. The dummy touch lines 35 are disposed in the second dividing openings 31A2 between the touch electrodes 31 that are adjacent to each other in the X-axis direction. Namely, the dummy touch lines 35 do not cross the joint sections 32B included in the resistance-reduced portions 32.

Figure 14:
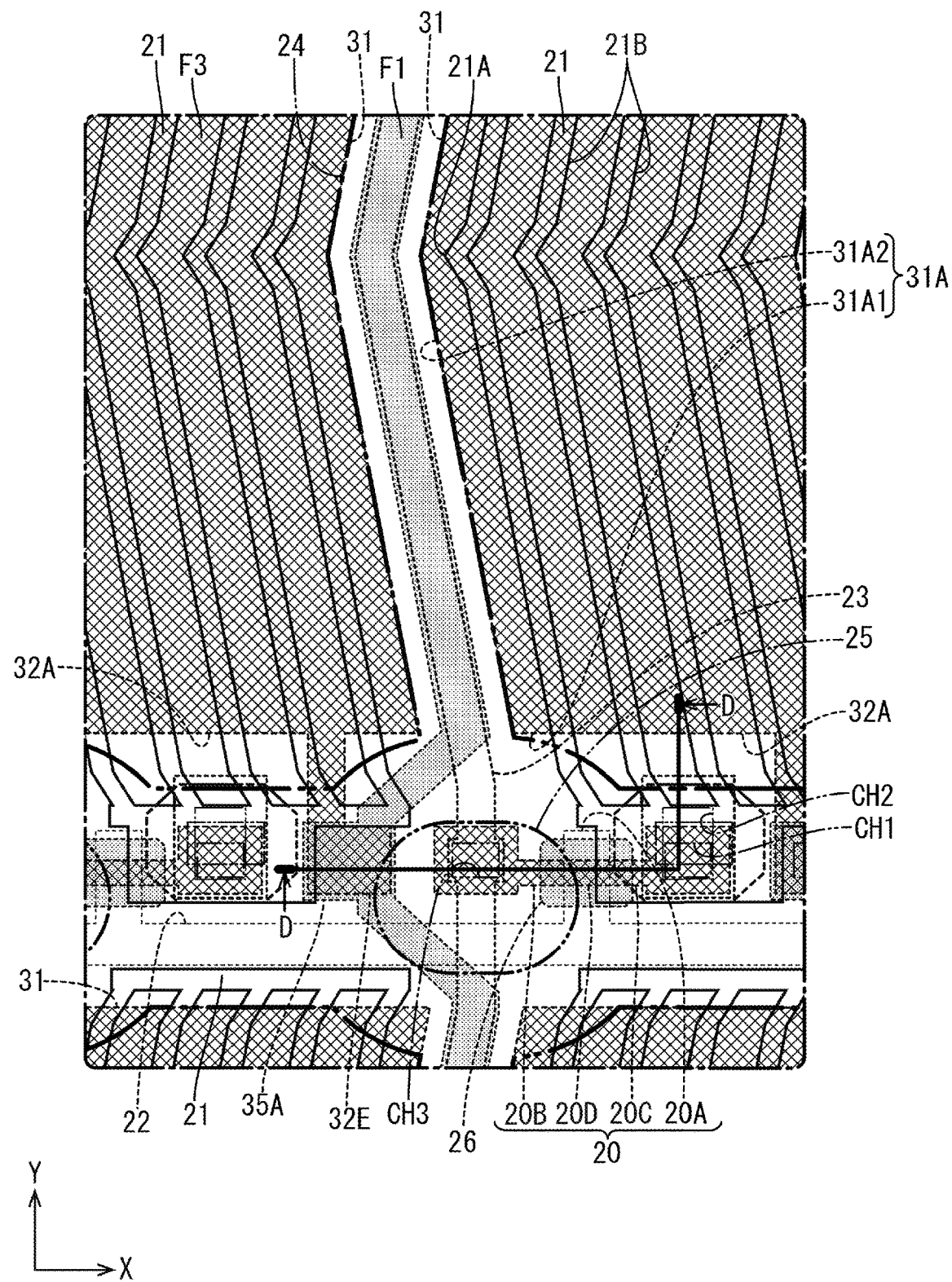
FIG. 14 is a plan view illustrating sections of the pattern of the first metal film and the semiconductor film around the dummy touch line in the liquid crystal panel.
Figure 15:
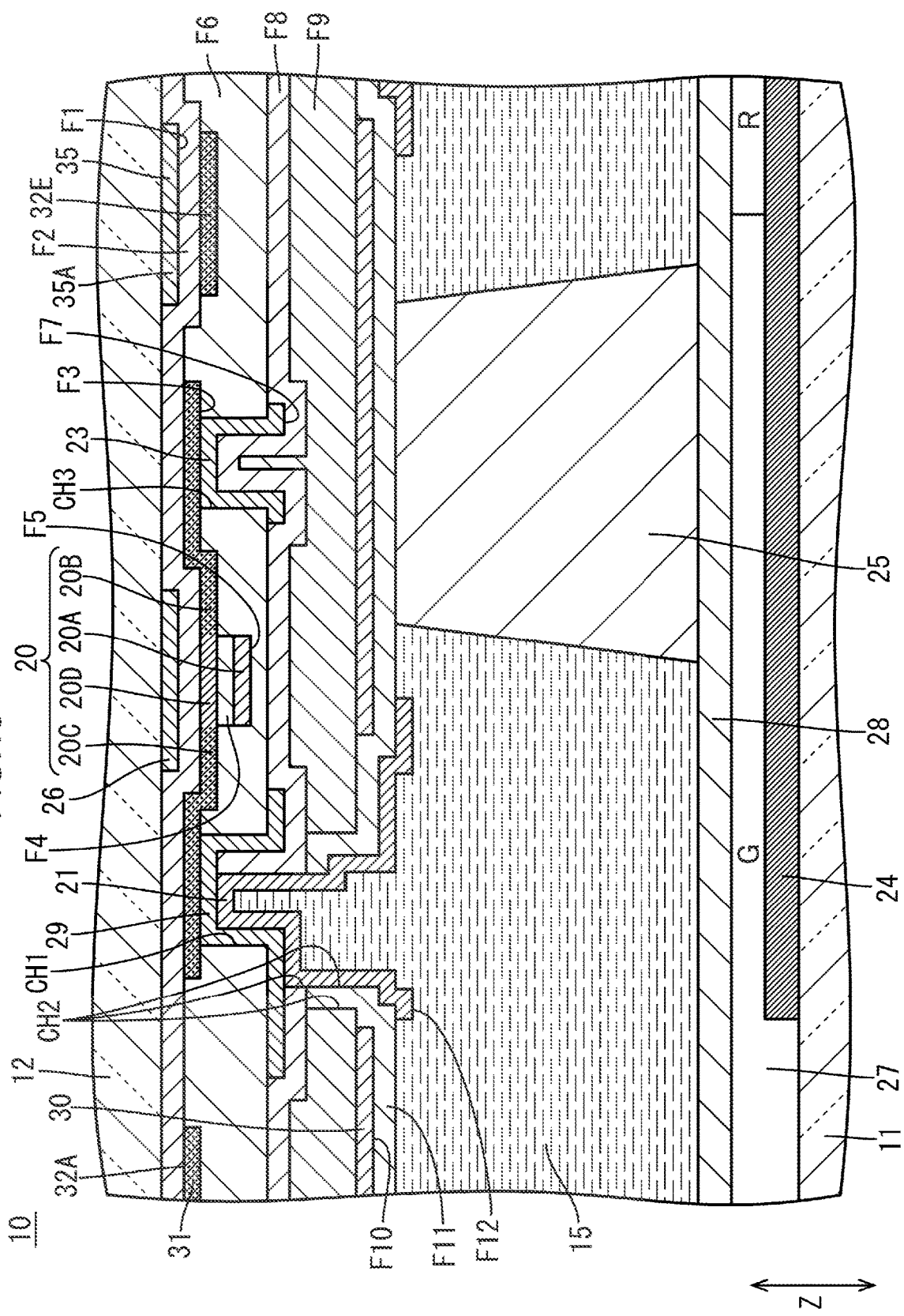
FIG. 15 is a cross-sectional view of the liquid crystal panel along line D-D in FIG. 14.

As illustrated in FIGS. 8 and 9, the dummy touch lines 35 are routed similarly to the coupling portions 33 and the touch lines 34 in the display area AA. More specifically, sections of the dummy touch lines 35 crossing the gate lines 22 are curved toward the left in FIGS. 8 and 9 to go around the TFTs 20. The curved sections are not opposite the source lines 23. As illustrated in FIG. 14, the dummy touch lines 35 include dummy touch line-side dummy contacts 35A in the curved sections. The dummy touch line-side dummy contacts 35A are not opposite the resistance-reduced portions 32. FIG. 14 is a plan view illustrating patterns of the first metal film F1 and the semiconductor film F3 around the dummy touch line 35 in the liquid crystal panel 10. In FIG. 14, sections of the first metal film F1 and the semiconductor film F3 are shaded with different shading patterns. The dummy touch line-side dummy contacts 35A are formed by widening sections of the dummy touch lines 35. The resistance-reduced portions 32 include resistance-reduced portion-side dummy contacts 32E that are disposed opposite the dummy touch line-side dummy contacts 35A. The resistance-reduced portion-side dummy contacts 32E are not coupled to the dummy touch line-side dummy contacts 35A. The resistance-reduced portion-side dummy contacts 32E project downward in FIG. 14 in the Y-axis direction from the pixel electrode opposite sections 32A. Ends of the resistance-reduced portion-side dummy contacts 32E having a greater width are opposite the dummy touch line-side dummy contacts 35A. The dummy touch line-side dummy contacts 35A and resistance-reduced portion-side dummy contacts 32E are positioned opposite joints between the source lines 23 and the source regions 20B (the source line contact holes CH3), joints between the pixel electrodes 21 and the drain regions 20C (the pixel contact holes CH1, CH2), joints between the resistance-reduced portions 32 and the coupling portions 33 (the coupling portion contact holes CH4), or joints between the resistance-reduced portions 32 and the touch lines 34 (the touch line contact holes CH5) (see FIGS. 8 and 9). As illustrated in FIG. 15, the first interlayer insulating film F2 is between the dummy touch line-side dummy contacts 35A that are formed from the first metal film F1 and the resistance-reduced portion-side dummy contacts 32E that are formed from the semiconductor film F3. The first interlayer insulating film F2 insulates the dummy touch line-side dummy contacts 35A from the resistance-reduced portion-side dummy contacts 32E. FIG. 15 is a cross-sectional view of the liquid crystal panel along line D-D in FIG. 14. The spacers 25 are opposite sections of the dummy touch line-side dummy contacts 35A and the resistance-reduced portion-side dummy contacts 32E. The dummy touch lines 35 are in planar pattern (planar shape) similar to the pattern of the touch lines 34 except that the dummy touch lines 35 are disposed in the second dividing openings 31A2.

This embodiment includes the configurations described above. Next, functions, operation, and effects will be described. In this embodiment, as illustrated in FIG. 5, the common electrode 30 and the touch electrodes 31 are disposed in different layers in the array substrate 12, that is, structurally and electrically independent from each other. The common electrode 30 exclusively receives the common voltage signals. The touch electrodes 31 exclusively receive the touch signals. In comparison to a configuration in which the common electrode includes divided portions and perform both the display function a function to generate electric fields between the common electrode and the pixel electrodes 21) and the position detecting function, variations in potential of the common electrode 30 is less likely to occur. Further, sufficient amounts of a display period (a period to generate the electric fields between the pixel electrodes 21 and the common electrode 30) and a position detecting period can be obtained. Therefore, image display can be performed with higher quality and position detection can be performed with higher sensitivity.

As illustrated in FIG. 5, large portions of the touch electrodes 31 are formed from the semiconductor film F3 and the second layer from the lower side (the input surface 12A side) following the first metal film F1 among the conductive films included in the array substrate 12. Namely, the touch electrodes 31 are located in a layer lower than the gate lines 22 and the source lines 23. The touch electrodes 31 are closer to the position input body that approaches the input surface 12A during the position input than the gate lines 22 and the source lines 23. The electric fields generated by the gate lines 22 and the source lines 23 are less likely to affect the electrostatic capacitance between the position input body and the touch electrodes 31. The common electrode 30 is formed from the first transparent electrode film F10 and in the second layer from the upper side (the liquid crystal layer 15 side) following the second transparent electrode film F12 among the conductive films in the array substrate 12. The orientation of the liquid crystal molecules in the liquid crystal layer 15 is properly controlled by the electric fields between the common electrode 30 and the pixel electrodes 21. Therefore, the images are displayed with higher quality.

As illustrated in FIG. 6, the touch lines 34 are formed from the first metal film F1 that is the conductive film from which the light blocking portions 26 are formed. Namely, the touch lines 34 and the light blocking portions 26 can be patterned using the same photomask in the production of the array substrate 12. The touch electrodes 31 are formed from the semiconductor film F3 from which the channel regions 20D of the TFTs 20 are formed. Namely, the touch electrodes 31 and the channel regions 20D can be patterned using the same photomask in the production of the array substrate 12. Therefore, the number of photomasks required for the production of the array substrate 12 can be reduced. This is preferable for reduction in production cost of the liquid crystal panel 10. The touch lines 34 that are formed from the first metal film F1 and the touch electrodes 31 that are formed from the semiconductor film F3 are in the layers lower than the gate lines (the second metal film F5) and the source lines 23 (the third metal film F7) and adjacent to each other. Therefore, higher reliability can be achieved in connection between the touch lines 34 and the touch electrodes 31.

As illustrated in FIGS. 8 and 9, each touch electrode 31 includes multiple resistance-reduced portions 32 and the coupling portion 33. The resistance-reduced portions 32 include the sections of the semiconductor film F3 having the reduced resistances. The coupling portion 33 crosses the gate line 22. The coupling portion 33 is coupled to the resistance-reduced portions 32 that are adjacent to each other. The coupling portions 33 are formed from the first metal film F1 that is the conductive film different from the second metal film F5 and the semiconductor film F3. With the coupling portions 33, the resistance-reduced portions 32 with the gate lines 22 disposed therebetween are maintained at the same potential. According to the configuration, potential differences are less likely to be created among the resistance-reduced portions 32. This is preferable for expansion of the touch electrodes 31 in the Y-axis direction. Further, the coupling portions 33 can be formed by patterning the first metal film F1 using the same photomask with which the touch lines 34 are patterned in the production of the array substrate 12. Therefore, the number of the photomasks can be further reduced.

As illustrated in FIG. 10, the touch lines 34 are coupled to the resistance-reduced portions 32 in the touch electrodes 31, respectively. The potential differences are less likely to be created between the resistance-reduced portions 32 in the touch electrodes 31.

As illustrated in FIGS. 8 and 9, the resistance-reduced portions 32 in the touch electrodes 31 include the sections that extend in the X-axis direction, which is equal to the extending direction in which the gate lines 22 extend, and cross the source lines 23. The sections having the less width are defined as the joint sections 32B. In comparison to a configuration in which the resistance-reduced portions have a constant width in the Y-axis direction, parasitic capacitances between the source lines 23 and the resistance-reduced portions are reduced. Further, parasitic capacitances between the resistance-reduced portions 32 and touch lines 34 to which the resistance-reduced portions 32 in the touch electrodes 31 that are different from the touch electrodes 31 that include the resistance-reduced portions 32 are coupled are reduced. Therefore, proper levels of sensitivity can be achieved in position detection.

As illustrated in FIGS. 8 and 9, the coupling portions 33, the touch lines 34, and the dummy touch lines 35 are opposite the source lines 23 with the first interlayer insulating film F2 and the third interlayer insulating film F6 between the source lines 23 and other components, that is, the coupling portions 33, the touch lines 34, and the dummy touch lines 35. In comparison to a configuration in which the coupling portions and the touch lines are not opposite the source lines 23, areas occupied by the coupling portions 33, the touch lines 34, and the source lines 23 can be reduced. This is advantageous for increasing aperture ratios. If the dummy touch lines are not opposite the source lines 23, difference in load may be created between the source lines 23 that are opposite the touch lines 34 and the source lines 23 that are between the adjacent touch electrodes 31 and are not opposite the touch lines 34. Because the dummy touch lines 35 are included in this embodiment, differences in load are less likely to be created between the source lines 23 that are opposite the touch lines 34 and the source lines 23 that are between the adjacent touch electrodes 31. This improves the display quality.

As described above, the array substrate 12 in this embodiment includes the gate lines 22, the source lines 23, the TFTs 20 (the switching components), the touch electrodes 31, the light blocking portions 26, and the touch lines 34 (the position detecting lines). The source lines 23 cross the gate lines 22. The TFTs 20 include the gate electrodes 20A, the channel regions 20D, the source regions 20B, and the drain regions 20C. The gate electrodes 20A are coupled to the gate lines 22. The channel regions 20D are formed from the semiconductor film F3. The channel regions 20D are in the layer lower than the gate electrodes 20A and opposite the gate electrodes 20A with the second interlayer insulating film F4 (the gate insulating film) between the gate electrodes 20A and the channel regions 20D. The source regions 20B are coupled to the source lines 23 and the first ends of the channel regions 20D. The drain regions 20C are coupled to the second ends of the channel regions 20D. The touch electrodes 31 detect input positions at which the position input operation is performed with the position input body based on the electrostatic capacitances between the position input body and the touch electrodes 31. The touch electrodes 31 are in the layer lower than the gate lines 22 and the source lines 23. The light blocking portions 26 are in the layer lower than the channel regions 20D with the first interlayer insulating film F2 (the lower insulating film) between the channel regions 20D and the light blocking portions 26. The light blocking portions 26 are opposite the channel regions 20D. The touch lines 34 are coupled to the touch electrodes 31. The touch lines 34 are formed from the first metal film F1 that is the conductive film from which the light blocking portions 26 are formed.

When the signals transmitted through the gate lines 22 are supplied to the gate electrodes 20A, the TFTs 20 turn on. The signals transmitted through the source lines 23 are supplied from the source regions 20B to the drain regions 20C via the channel regions 20D. Because the light blocking portions 26 are disposed in the layer lower than the channel regions 20D that are formed from the semiconductor film F3 and opposite the channel regions 20D with the first interlayer insulating film F2 between the channel regions 20D and the light blocking portions 26, the light from the lower layer side toward the channel regions 20D are blocked by the light blocking portions 26. According to the configuration, variations in characteristics of the TFTs 20 resulting from the light applied to the channel regions 20D can be reduced.

The touch electrodes 31 detect the input positions at which the position input operation is performed with the position input body using the signals supplied through the touch lines 34 based on the electrostatic capacitances between the position input body and the touch electrodes 31. The touch electrodes 31 are in the layer lower than the gate lines 22 and the source lines 23. If the surface of the array substrate 12 on an opposite side from the surface on which the components are disposed is configured as an input surface through which the position input operation is performed with the position input body, the tough electrodes 31 may be closer to the position input boy than the gate lines 22 and the source lines 23. Therefore, the electric fields created by the gate lines and the source lines 23 are less likely to affect the electrostatic capacitances between the position input body and the touch electrodes 31. This improves the sensitivity in position detection.

The touch lines 34 are formed from the first metal film F1 that is the conductive film from which the light blocking portions 26. In the production, the touch lines 34 and the light blocking portions 26 can be produced through patterning using the same photomask. Namely, this configuration is advantageous for reducing the number of photomasks. The touch lines 34 and the touch electrodes 31 are in the layers lower than the gate lines 22 and the source lines 23. The touch lines 34 and the touch electrodes 31 are closer to each other. Therefore, the reliability in connection is high.

The TFTs 20 include the channel regions 20D that are formed from the sections of the semiconductor film F3. The touch electrodes 31 include the resistance-reduced portions 32 that are formed from the sections of the semiconductor film F3 with the reduced resistances. The touch electrodes 31 are formed from the semiconductor film F3 from which the channel regions 20D are formed. In the production, the touch electrodes 31 and the channel regions 20D are produced through patterning using the same photomask. This is advantageous for reducing the number of the photomasks. The resistances of the sections of the semiconductor film F3 not opposite the gate electrodes 20A are reduced by performing resistance-reducing process on the semiconductor film F3 using the gate electrodes 20A opposite the channel regions 20D as a photomask.

The array substrate 12 according to this embodiment includes the gate lines 22, the source lines 23, the TFTs 20, the touch lines 34, and the touch electrodes 31. The source lines 23 cross the gate lines 22. The gate electrodes 20A are coupled to the gate lines 22. The TFTs 20 include the gate electrodes 20A, the channel regions 20D, the source regions 20B, and the drain regions 20C. The gate electrodes 20A are coupled to the gate lines 22. The channel regions 20D are in the layer lower than the gate electrodes 20A with the second interlayer insulating film F4 between the gate electrodes 20A and the channel regions 20D. The channel regions 20D are formed from the semiconductor film F3. The source regions 20B are coupled to the source lines 23 and the first ends of the channel regions 20D. The drain regions 20C are coupled to the second ends of the channel regions 20D. The touch electrodes 31 are coupled to the touch lines 34. The touch electrodes 31 detect the input positions at which the position input operation is performed with the position input body based on the electrostatic capacitances between the position input body and the touch electrodes 31. The touch electrodes 31 include the resistance-reduced portions 32 formed by reducing the resistances of the sections of the semiconductor film F3. The resistance-reduced portions 32 are in the layer lower than the gate lines 22 and the source lines 23.

When the signals transmitted through the gate lines 22 are supplied to the gate electrodes 20A, the TFTs 20 turn on. The signals transmitted through the source lines 23 are supplied from the source regions 20B to the drain regions 20C via the channel regions 20D. The light blocking portions 26 are disposed in the layer lower than the channel regions 20D that are formed from the semiconductor film F3 with the first interlayer insulating film F2 with the light blocking portions 26 and the channel regions 20D. The light blocking portions 26 are opposite the channel regions 20D. Therefore, the light from the lower layer side toward the channel regions 20D are blocked by the light blocking portions 26. This reduces the variations in characteristics of the TFTs 20 resulting from the light applied to the channel regions 20D.

The touch electrodes 31 detect the input positions at which the position input operation is performed with the position input body using the signals supplied through the touch lines 34 based on the electrostatic capacitances between the position input body and the touch electrodes 31. The touch electrodes 31 are in the layer lower than the gate lines 22 and the source lines 23. If the surface of the array substrate 12 on an opposite side from the surface on which the components are disposed is configured as an input surface through which the position input operation is performed with the position input body, the tough electrodes 31 may be closer to the position input boy than the gate lines 22 and the source lines 23. Therefore, the electric fields created by the gate lines and the source lines 23 are less likely to affect the electrostatic capacitances between the position input body and the touch electrodes 31. This improves the sensitivity in position detection.

The touch electrodes 31 are formed from the semiconductor film F3 from which the channel regions 20D are formed. In the production, the touch electrodes 31 and the channel regions 20D are produced through patterning using the same photomask. This is advantageous for reducing the number of the photomasks. The resistances of the sections of the semiconductor film F3 not opposite the gate electrodes 20A are reduced by performing resistance-reducing process on the semiconductor film F3 using the gate electrodes 20A opposite the channel regions 20D as a photomask.

The resistance-reduced portions 32 are arranged at intervals such that each gate line 22 is between the adjacent resistance-reduced portions 32. Each touch electrode 31 crosses the corresponding gate line 22 and is coupled to the adjacent resistance-reduced portions 32. The touch electrodes include the coupling portions 33 that are formed from the first metal film F1 that is the conductive film different from the semiconductor film F3 and the second metal film F5 that is the conductive film from which the gate lines 22 are formed. If the semiconductor film is patterned so that the touch electrodes 21 are opposite the gate lines 22, the resistances of the sections of the semiconductor film opposite the gate lines 22 cannot be reduced through the resistance reducing process. Because the coupling portions 33 that are formed from the first metal film F1 that is the conductive film different from the semiconductor film F3 and the second metal film F5 that is the conductive film from which the gate lines 22 are formed cross the respective gate lines 22 and are coupled to the adjacent resistance-reduced portions 32, the resistance-reduced portions 32 sandwiching the respective gate lines 22 are maintained at the same potential. According to the configuration, the potential differences are less likely to be created among the resistance-reduced portions 32. This is advantageous for expanding the areas in which the touch electrodes 31 are formed.

The coupling portions 33 are formed from the first metal film F1 that is the conductive film from which the touch lines 34 are formed. Because the coupling portions 33 are formed from the first metal film F1 that is the conductive film from which the touch lines 34 are formed, the coupling portions and the touch lines 34 are formed through the patterning using the same photomask in the production. This is advantageous for further reducing the number of the photomasks.

Each touch line 34 is coupled to multiple resistance-reduced portions 32 included in the target touch electrode 31. According to the configuration, the signals transmitted through the touch line 34 are supplied to the resistance-reduced portions 32 in the target touch electrode 31, respectively. Therefore, the potential differences are less likely to be created among the resistance-reduced portions 32.

At least sections of the coupling portions 33 are opposite the source lines 23 with the first interlayer insulating film F2 and the third interlayer insulating film F6, which are insulating films, between the sections of the coupling portions 33 and the source lines 23. In comparison to a configuration in which the coupling portions are not opposite the source lines 23, the areas occupied by the coupling portions 33 and the source lines 23 can be reduced. This is advantageous for increasing the aperture ratios.

The pixel electrodes 21 are arranged to sandwich the source lines 23, respectively. The pixel electrodes 21 are coupled to the drain regions 20C of the TFTs 20. The resistance-reduced portions 32 include the pixel electrode opposite sections 32A and the joint sections 32B. The pixel opposite sections 32A are opposite at least the sections of the pixel electrodes 21, respectively, with the insulating films including the third interlayer insulating film F6, the fourth interlayer insulating film F8, the planarization film F9, and the fifth interlayer insulating film F11 between the sections of the pixel electrodes 21 and the pixel electrode opposite sections 32A. The joint sections 32B cross the respective source lines 23. The joint sections 32B are coupled to the adjacent pixel electrode opposite sections 32A. Each joint section 32B has the dimension in the extending direction in which the source lines 23 extend less than the dimension of each pixel electrode opposite section 32A. When the TFTs 20 turn on, the pixel electrodes 21 are charged to the potentials based on the signals transmitted through the source lines 23. The pixel electrode opposite sections 32A of the resistance-reduced portions 32 are connected by the joint sections 32B of the resistance-reduced portions 32. The joint sections 32B cross the source lines 23. The dimension of each joint section 32B in the extending direction in which the source lines 23 extend is less than each pixel electrode opposite section 32A. In comparison to a configuration in which the dimension of each resistance-reduced portion in the extending direction in which the source lines 23 extend is constant, the parasitic capacitances between the source lines 23 and the resistance-reduced portions 32 are reduced. This improves the sensitivity in the position detection.

At least the sections of the touch lines 34 are opposite the source lines 23 with the insulating films including the first interlayer insulating film F2 and the third interlayer insulating film F6 between the sections of the touch lines 34 and the source lines 23. In comparison to a configuration in which the touch lines are not opposite the source lines 23, the areas occupied by the touch lines 34 and the source lines 23 can be reduced. This is advantageous for improving the aperture ratios.

The touch electrodes 31 are arranged at intervals to sandwich the source lines 23, respectively. The dummy touch lines 35 (the dummy position detecting lines) are disposed opposite the source lines 23 between the adjacent touch electrodes 31 with the insulating films including the first interlayer insulating film F2 and the third interlayer insulating film F6 between the dummy touch lines 35 and the source lines 23. The dummy touch lines 35 are not coupled to any touch electrodes 31. If the dummy touch lines are not provided, differences in load may be created between the source lines 23 that are opposite the touch lines 34 and the source lines 23 that are between the touch electrodes 31 and not opposite the touch lines 34. Because the dummy touch lines 35 are disposed opposite the source lines 23 between the adjacent touch electrodes 31 with the insulating films including the first interlayer insulating film F2 and the third interlayer insulating film F6 between the source lines 23 and the dummy touch lines 35, the differences in load are less likely to be created between the source lines 23 that are opposite the touch lines 34 and the source lines 23 that are between the touch electrodes 31 and not opposite the touch lines 34. This improves the display quality.

The pixel electrodes 21 and the common electrode 30 are provided. The pixel electrodes 21 are coupled to the drain regions 20C of the TFTs 20. The common electrode 30 are opposite the pixel electrodes 21 with the fifth interlayer insulating film F11 that is the insulating film between the pixel electrodes 21 and the common electrode 30. The pixel electrodes 21 and the common electrode 30 are in the layers upper than the gate lines 22 and the source lines 23. According to the configuration, when the TFTs 20 turn on, the pixel electrodes 21 are charged to the potentials based on the signals that are transmitted through the source lines 23. The electric fields based on the potentials at the pixel electrodes 21 are created between the pixel electrodes 21 and the common electrode 30. When the array substrate 12 is used in the liquid crystal panel 10, the images are displayed using the electric fields created between the pixel electrodes 21 and the common electrode 30. The common electrode 30 are provided separately from the touch electrodes 31. In comparison to a configuration in which the common electrode includes segments and the has a function for creating electric fields between the segments and the pixel electrodes 21 and a function for detecting positions, the potential at the common electrode 30 is less likely to vary. Further, sufficient periods are obtained for creating the electric fields between the pixel electrodes 21 and the common electrode 30 and for detecting the positions. According to the configuration, proper display quality can be achieved for displaying the images and proper sensitivity is obtained for detecting the positions.

The liquid crystal panel 10 according to this embodiment includes the array substrate 12 described above and the CF substrate 11 (the opposed substrate). The CF substrate 11 is opposite the array substrate 12. According to the liquid crystal panel 10, the number of the photomasks required for production of the array substrate 12 can be reduced and thus the production cost can be reduced.

Second Embodiment

A second embodiment will be described with reference to FIGS. 16 to 18. The second embodiment includes. Components, functions, and effects similar to those of the first embodiment previously described will not be described.

Figure 16:
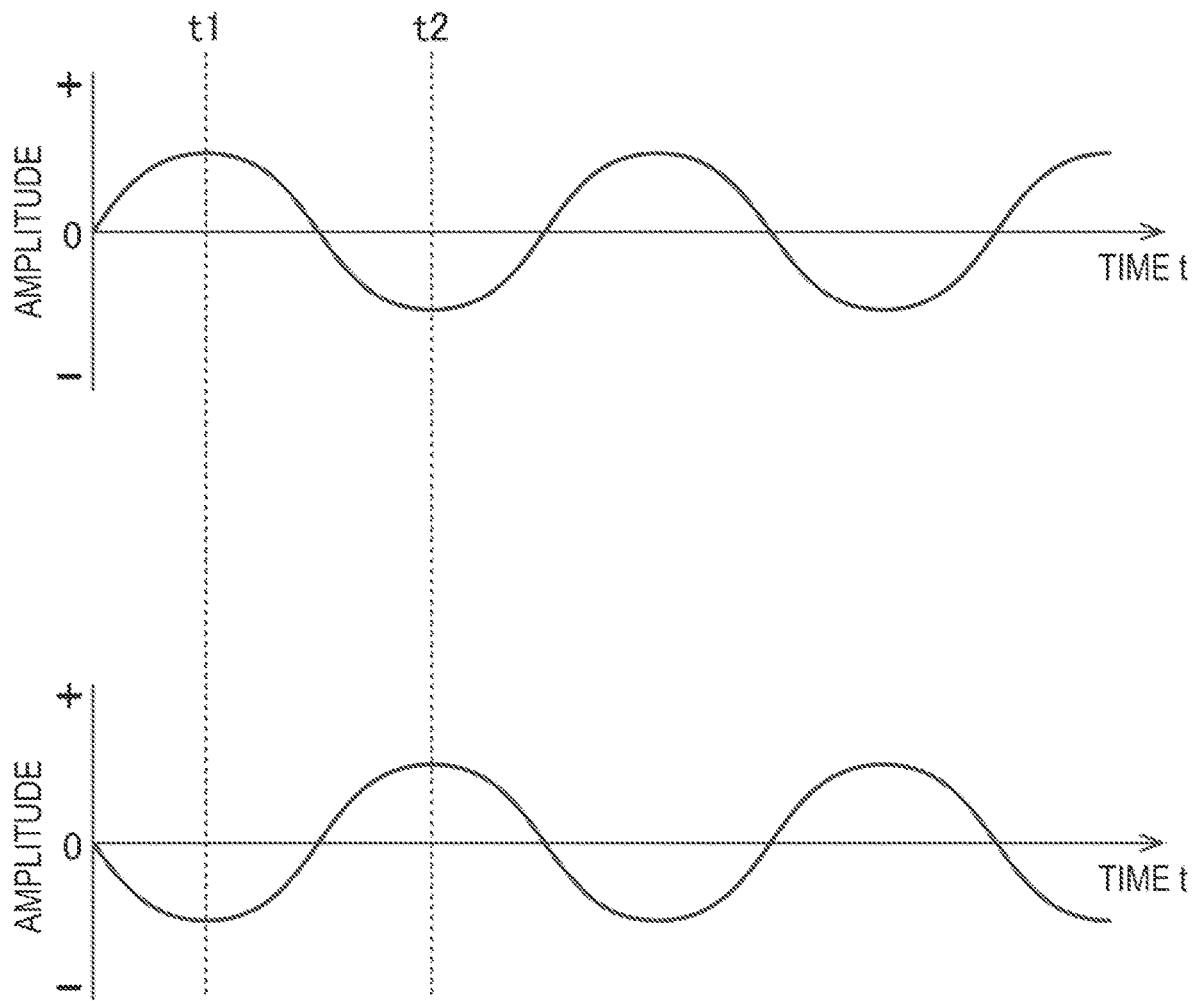
FIG. 16 is a diagram illustrating waveforms of touch signals supplied to touch electrodes according to a second embodiment.

A driver according to this embodiment supply two kinds of touch signals illustrated in FIG. 16 to touch lines coupled to touch electrodes 131 disposed in a display area, respectively. The two kinds of the touch signals are opposite in phase with each other. FIG. 16 is a diagram illustrating waveforms of the touch signals supplied from the driver to the touch electrodes 131. In FIG. 16, the horizontal axis represents time t. In FIG. 16, the vertical axis represents amplitude of the touch signals with symbols (+, −) that indicate polarities. Specifically, the touch signals output by the driver to the touch lines include first touch signals and second touch signals. The first touch signals has the waveform on the upper side in FIG. 16. The second touch signals has the waveform on the lower side in FIG. 16. The first touch signals and the second touch signals are opposite in phase with each other, that is, the polarities of the first touch signals and the second touch signals at the same timing are opposite to each other. Specifically, at time t1, the polarity of the first touch signal is positive whereas the polarity of the second touch signal is negative. At time t2 ($\lambda/2$ after time t1), the polarity of the first touch signal is negative whereas the polarity of the second touch signal is positive.

Figure 17:
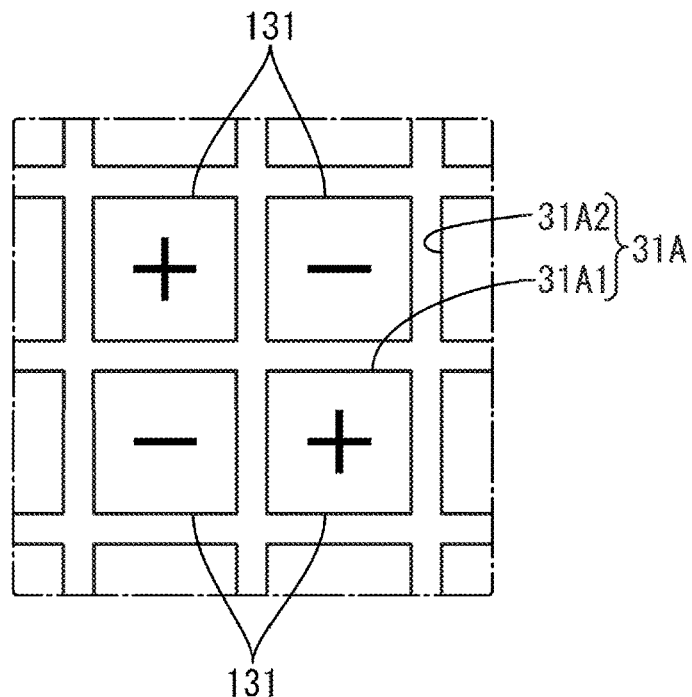
FIG. 17 is a view illustrating polarities of the touch electrodes at time t1 in FIG. 16.
Figure 18:
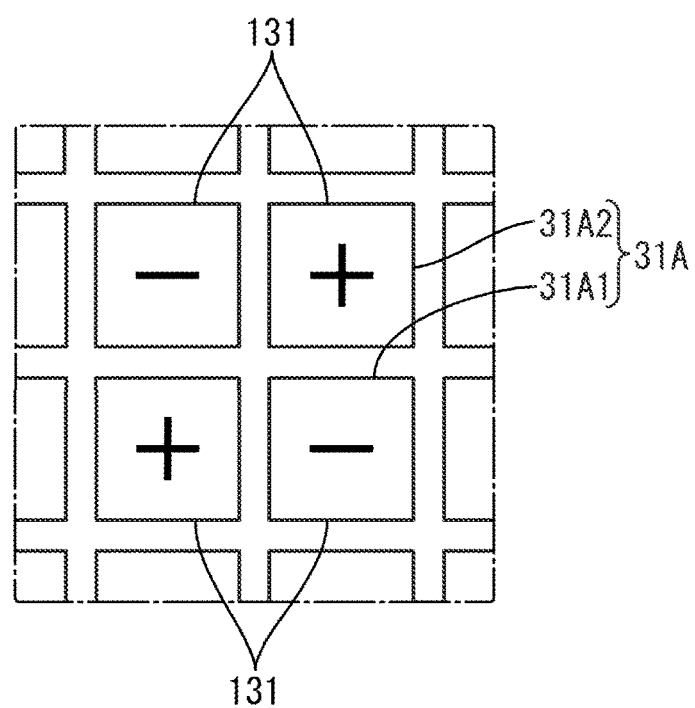
FIG. 18 is a view illustrating polarities of the touch electrodes at time t2 in FIG. 16.

As illustrated in FIGS. 17 and 18, the driver supplies the touch signals to the touch electrodes 131 so that the phases of the touch signals supplied to the touch electrodes 131 adjacent to each other in the X-axis direction in the display area are opposite to each other and the phases of the touch signals supplied to the touch electrodes 131 adjacent to each other in the Y-axis direction in the display area are opposite to each other. FIG. 17 illustrates the polarities of the touch electrodes 131 at time t1 illustrated in FIG. 16. FIG. 18 illustrates the polarities of the touch electrodes 131 at time t2 illustrated in FIG. 16. Specifically, the first touch signals are supplied from the driver to the touch lines couple to a first group of the touch electrodes 131 and the second touch signals are supplied from the driver to the touch lines coupled to a second group of the touch electrodes 131 adjacent to the first grope of the position detection electrodes in the X-axis direction. Similarly, the first touch signals are supplied from the driver to the touch lines couple to a first group of the touch electrodes 131 and the second touch signals are supplied from the driver to the touch lines coupled to a second group of the touch electrodes 131 adjacent to the first grope of the position detection electrodes in the Y-axis direction. At time t1 and time t1, the touch electrodes 131 with the positive polarity and the touch electrodes 131 with the negative polarity are in zigzag arrangement in a plan view.

Parasitic capacitances are created between the touch electrodes 131 and the common electrode. If variations in potential of the touch electrodes 131 occur, the variations may result in variations in potential of the common electrode. In this embodiment, the touch signals in opposite phase are supplied from the driver to the touch lines coupled to the adjacent touch electrodes 131. Therefore, effects of the variations on the common electrode are cancelled. Because the variations in potential of the common electrode are less likely to occur and thus proper display quality is achieved.

The embodiment described above includes the driver (a signal supply) that is coupled to the touch lines to supply the touch signals (the position detecting signals) to the touch lines. The touch electrodes 131 are arranged at intervals. The driver supplies the touch signals in opposite phases to the touch lines coupled to the adjacent touch electrodes 131, respectively. In comparison to a configuration in which the driver supplies the touch signals in the same phase to all of the touch lines, the potential of the common electrode is less likely to vary when the parasitic capacitances are created between the touch electrodes 131 and the common electrode. This improves the display quality.

Other Embodiments

The technology described herein is not limited to the embodiments described above and illustrated by the drawings. For example, the following embodiments will be included in the technical scope of the present invention.

(1) Each touch electrode 31, 131 may include multiple coupling portions 33. If so, it is preferable that the coupling portions 33 are separated from each other in the X-axis direction in the resistance-reduced portion 32 (e.g., ones at the edges of the resistance-reduced portion 32 and one at the middle of the resistance-reduced portion 32).

(2) The coupling portions 33 may not be coupled to all of the resistance-reduced portions 32 included in the touch electrodes 31, 131. The coupling portions 33 may be coupled to some of the resistance-reduced portions 32 included in the touch electrodes 31, 131. In such a configuration, the resistance-reduced portions 32 may be grouped such that each group includes multiple resistance-reduced portions 32. The number of the coupling portions 33 may be set equal to the number of groups of the resistance-reduced portions 32 and the coupling portions 33 may be coupled to the groups of the resistance-reduced portions 32, respectively.

(3) The coupling portions 33 may be omitted if the touch lines 34 are coupled to all of the resistance-reduced portions 32 included in the target touch electrodes 31, 131.

(4) The touch lines 34 may not be coupled to all of the resistance-reduced portions 32 included in the target touch electrodes 31, 131. The touch lines 34 may be coupled to some of (or one of) the resistance-reduced portions 32. In such a configuration, the touch signals can be supplied to the resistance-reduced portions 32 that are not coupled to the touch lines 34 via the resistance-reduced portions 32 that are coupled to the touch lines 34.

(5) Multiple touch lines 34 may be coupled to each touch electrode 31, 131.

(6) The layouts of the coupling portions 33 and the touch lines 34 in the forming areas of the touch electrodes 31, 131 may be altered where appropriate.

(7) The number, the layouts, and the width of the joint sections 32B included in the resistance-reduced portions 32 may be altered where appropriate. For example, the joint sections 32B may be coupled to edge sections of the pixel electrode opposite sections 32A at ends of the pixel electrode opposite section 32A with respect to the Y-axis direction. The joint sections 32B may be coupled to multiple sections of the pixel electrode opposite sections 32A. The sections may be at intervals in the Y-axis direction.

(8) The light blocking portions 26 may be coupled to the gate electrodes 20A of the TFTs 20 so that the light blocking portions 26 may function as second gate electrodes. Namely, each TFT 20 may have a double-gate configuration.

(9) The light blocking portions 26 may be omitted.

(10) The touch electrodes 31, 131 may be formed from a conductive film that is different from the semiconductor film F3. The conductive film may have light transmissivity. In such a case, a third transparent electrode film may be formed on the array substrate 12 and the touch electrodes 31, 131 may be formed by patterning the third transparent electrode film.

(11) In the second embodiment, the same kind of touch signals may be supplied to the touch lines coupled to the touch electrodes 131 that are arranged in the X-axis direction and different kinds of tough signals may be supplied to the touch lines coupled to the touch electrodes that are adjacent to each other in the Y-axis direction. Similarly, the same kind of touch signals may be supplied to the touch lines coupled to the touch electrodes 131 that are arranged in the Y-axis direction and different kinds of tough signals may be supplied to the touch lines coupled to the touch electrodes that are adjacent to each other in the X-axis direction.

(12) The coupling portions 33 may not be opposite the source lines 23.

(13) The touch lines 34 may not be opposite the source lines 23.

(14) The dummy touch lines 35 may not be opposite the source lines 23.

(15) The pixel electrodes 21 may be formed from the first transparent electrode film F10 and the common electrode 30 may be formed from the second transparent electrode film F12. In such a configuration, the common electrode 30 may include slits for orientation control.

(16) The planar shape of each pixel electrode 21 may be altered where appropriate. The routing of the source lines 23 may be altered along with the alteration of the planar shape of the pixel electrode 21 where appropriate. The number and the planer shape of the slits 21B in the pixel electrodes 21 may be altered where appropriate.

(17) More than one driver 13 and more than one flexible circuit board 14 may be provided.

(18) The flexible circuit board 14 may be mounted on the array substrate 12 using the film-on-glass (FOG) technology. The driver 13 may be mounted on such a flexible circuit board 14 using the chip-on-film (COF) technology.

(19) The touchscreen pattern may use a mutual capacitance method instead of the self-capacitance method.

(20) The planar shape of the liquid crystal panel may be other than the vertically-long rectangular shape (e.g., a horizontally-long rectangular shape, a square shape, a trapezoidal shape, a circular shape, and an oval shape).

(21) The liquid crystal panel 10 may display images in TN mode, VA mode, or IPS mode rather than FFS mode.

(22) The liquid crystal panel 10 may be a reflective-type panel or a semi-transmissive-type panel. If the liquid crystal panel 10 is the reflective-type panel, the backlight is not required.

(23) Amorphous silicon or polysilicon (LTPS) rather than the oxide semiconductor film may be used for the semiconductor film F3.

(24) A display panel that is a different type of display panel from the liquid crystal panel 10 (e.g., an organic EL display panel, and a microcapsule-type electrophoretic display (EPD)) may be used.

The invention claimed is:

1. An array substrate comprising:
gate lines;
source lines crossing the gate lines;
switching components including:
 gate electrodes coupled to the gate lines;
 channel regions disposed in a layer lower than the gate electrodes and opposite the gate electrodes with a gate insulating film between the gate electrodes and the channel regions, the channel regions being formed from a semiconductor film;
 source regions coupled to the source lines and first ends of the channel regions; and
 drain regions coupled to second ends of the channel regions;
position detecting electrodes disposed in a layer lower than the gate lines and the source lines to detect input positions at which the position input operation is performed with a position input body based on electrostatic capacitances between the position input body and the position detecting electrodes;
a light blocking portion disposed in a layer lower than the channel regions and opposite the channel regions with a lower insulating film between the light blocking portion and the channel regions; and
position detecting lines formed from sections of a conductive film from which the light blocking portion is formed and coupled to the position detecting electrodes, wherein:
the position detecting electrodes include resistance-reduced portions formed by reducing resistances of sections of the semiconductor film.

2. The array substrate according to claim 1, further comprising pixel electrodes coupled to the drain regions of the switching components, wherein
the pixel electrodes are arranged at intervals such that at least one of the source lines is disposed between adjacent two of the pixel electrodes,
the resistance-reduced portions include pixel electrode opposite sections and joint sections,
the pixel electrode opposite sections are opposite at least sections of the pixel electrodes with an insulating film between the pixel electrode opposite sections and the pixel electrodes,
the joint sections crossing the source lines are coupled to adjacent two of the pixel electrode opposite sections opposite the adjacent two of the pixel electrodes, and
the joint sections have a dimension in an extending direction in which the source lines extend less than a dimension of the pixel electrode opposite sections in the extending direction.

3. The array substrate according to claim 1, wherein the position detecting lines include sections opposite the source lines with an insulating film between the sections of the position detecting lines and the source lines.

4. The array substrate according to claim 3, wherein
the position detecting electrodes are arranged at intervals such that at least one of the source lines is disposed between adjacent two of the position detecting electrodes,
the array substrate further comprises dummy position detecting lines opposite the source lines between the position detecting electrodes with an insulating film between the dummy position detecting lines and the source lines, and
the dummy position detecting lines are not coupled to the position detecting electrodes.

5. The array substrate according to claim 1, further comprising:
pixel electrodes coupled to the drain regions of the switching components; and
a common electrode opposite the pixel electrodes with an insulating film between the pixel electrodes and the common electrode, wherein
the pixel electrodes and the common electrode are in layers upper than the gate lines and the source lines.

6. The array substrate according to claim 5, further comprising a signal source coupled to the position detecting lines to supply position detecting signals to the position detecting lines, wherein
the position detecting electrodes are arranged at intervals, and
the signal source supplies position detecting signals to the position detecting lines coupled to a first group of the position detecting electrodes and position detecting signals in opposite phase to the position detecting lines coupled to a second group of the position detecting electrodes adjacent to the first group of the position detecting electrodes.

7. A display device comprising:
the array substrate according to claim 1; and
an opposed substrate opposite the array substrate.

8. The array substrate accordingly to claim 1, wherein
the resistance-reduced portions are arranged at intervals such that at least one of the gate lines is disposed between adjacent two of the resistance-reduced portions,
the position detecting electrodes include coupling portions formed from a conductive film that is different from the conductive film from which the gate lines are formed and from the semiconductor film, and
the coupling portions crossing the gate lines are coupled to the resistance-reduced portions.

9. The array substrate accordingly to claim 8, wherein the coupling portions are formed from the conductive film from which the position detecting lines are formed.

10. An array substrate comprising:
gate lines;
source lines crossing the gate lines;
switching components including:
gate electrodes coupled to the gate lines;
channel regions disposed in a layer lower than the gate electrodes and opposite the gate electrodes with a gate insulating film between the gate electrodes and the channel regions, the channel regions being formed from a semiconductor film;
source regions coupled to the source lines and first ends of the channel regions; and
drain regions coupled to second ends of the channel regions;
position detecting lines; and
position detecting electrodes coupled to the position detecting lines to detect input positions at which position input operation is performed with a position input body based on electrostatic capacitances between the position input body and the position detecting electrodes, the position detecting electrodes being formed by reducing resistances of sections of a semiconductor film and in a layer lower than the gate lines and the source lines.

11. The array substrate according to claim 10, wherein
the resistance-reduced portions are arranged at intervals such that at least one of the gate lines is disposed between adjacent two of the resistance-reduced portions,
the position detecting electrodes include coupling portions formed from a conductive film that is different from the conductive film from which the gate lines are formed and from the semiconductor film, and
the coupling portions crossing the gate lines are coupled to the resistance-reduced portions.

12. The array substrate according to claim 11, wherein the coupling portions are formed from the conductive film from which the position detecting lines are formed.

13. The array substrate according to claim 11, wherein the position detecting lines are coupled to the resistance-reduced portions included in the position detecting electrodes that are targets to be coupled.

14. The array substrate according to claim 11, wherein the coupling portions include sections opposite the source lines with an insulating film between the sections of the coupling portions and the source lines.

15. The array substrate according to claim 10, further comprising pixel electrodes coupled to the drain regions of the switching components, wherein
the pixel electrodes are arranged at intervals such that at least one of the source lines is disposed between adjacent two of the pixel electrodes,
the resistance-reduced portions include pixel electrode opposite sections and joint sections, the pixel electrode opposite sections are opposite at least sections of the pixel electrodes with an insulating film between the pixel electrode opposite sections and the pixel electrodes, the joint sections crossing the source lines are coupled to adjacent two of the pixel electrode opposite sections opposite the adjacent two of the pixel electrodes, and the joint sections have a dimension in an extending direction in which the source lines extend less than a dimension of the pixel electrode opposite sections in the extending direction.

16. The array substrate according to claim 10, wherein the position detecting lines include sections opposite the source lines with an insulating film between the sections of the position detecting lines and the source lines.

17. The array substrate according to claim 16, wherein the position detecting electrodes are arranged at intervals such that at least one of the source lines is disposed between adjacent two of the position detecting electrodes, the array substrate further comprises dummy position detecting lines opposite the source lines between the position detecting electrodes with an insulating film between the dummy position detecting lines and the source lines, and the dummy position detecting lines are not coupled to the position detecting electrodes.

18. The array substrate according to claim 10, further comprising:

pixel electrodes coupled to the drain regions of the switching components; and a common electrode opposite the pixel electrodes with an insulating film between the pixel electrodes and the common electrode, wherein the pixel electrodes and the common electrode are in layers upper than the gate lines and the source lines.

19. The array substrate according to claim 18, further comprising a signal source coupled to the position detecting lines to supply position detecting signals to the position detecting lines, wherein the position detecting electrodes are arranged at intervals, and the signal source supplies position detecting signals to the position detecting lines coupled to a first group of the position detecting electrodes and position detecting signals in opposite phase to the position detecting lines coupled to a second group of the position detecting electrodes adjacent to the first group of the position detecting electrodes.

20. A display device comprising:

the array substrate according to claim 10; and an opposed substrate opposite the array substrate.

* * * * *